US012087556B2

(12) United States Patent
Sato et al.

(10) Patent No.: US 12,087,556 B2
(45) Date of Patent: Sep. 10, 2024

(54) PLASMA PROCESSING APPARATUS AND PLASMA PROCESSING METHOD

(71) Applicant: KIOXIA CORPORATION, Tokyo (JP)

(72) Inventors: Yosuke Sato, Kanagawa (JP); Akio Ui, Tokyo (JP); Hisataka Hayashi, Mie (JP)

(73) Assignee: Kioxia Corporation, Tokyo (JP)

( * ) Notice: Subject to any disclaimer, the term of this patent is extended or adjusted under 35 U.S.C. 154(b) by 373 days.

(21) Appl. No.: 17/356,195

(22) Filed: Jun. 23, 2021

(65) Prior Publication Data

US 2021/0319986 A1 Oct. 14, 2021

Related U.S. Application Data

(62) Division of application No. 15/461,630, filed on Mar. 17, 2017, now abandoned, which is a division of (Continued)

(30) Foreign Application Priority Data

Jul. 22, 2014 (JP) .................. 2014-149241

(51) Int. Cl.
*H01L 21/3065* (2006.01)
*C23C 16/50* (2006.01)
(Continued)

(52) U.S. Cl.
CPC ........ *H01J 37/32577* (2013.01); *C23C 16/50* (2013.01); *H01J 37/32009* (2013.01);
(Continued)

(58) Field of Classification Search
CPC ..................... H01J 37/32577; H01L 21/3065
See application file for complete search history.

(56) References Cited

U.S. PATENT DOCUMENTS 3,650,019 A * 3/1972 Robinson ............... H01L 21/00
257/E29.264
4,520,421 A * 5/1985 Sakitani .............. H01L 21/6831
269/903
(Continued)

FOREIGN PATENT DOCUMENTS

JP      H7-169745 A     7/1995
JP      2003-309111 A   10/2003
(Continued)

OTHER PUBLICATIONS

English machine translation of JP-2004-259832-A (Year: 2004).
(Continued)

*Primary Examiner* — Thomas T Pham
(74) *Attorney, Agent, or Firm* — Finnegan, Henderson, Farabow, Garrett & Dunner, LLP

(57) ABSTRACT

A plasma processing apparatus of an embodiment includes a chamber, an introducing part, a substrate electrode, a high-frequency power source, a low-frequency power source, and a switching mechanism. The introducing part introduces a process gas into the chamber. The substrate electrode is disposed in the chamber, a substrate is directly or indirectly mounted on the substrate electrode, and the substrate electrode includes a first and a second electrode elements alternately arranged. The high-frequency power source outputs a high-frequency voltage of 40 MHz or more for ionizing the process gas to generate plasma. The low-frequency power source outputs a low-frequency voltage of 20 MHz or less for introducing ions from the plasma. The switching mechanism applies the low-frequency voltage alternately to the first and the second electrode elements.

8 Claims, 29 Drawing Sheets

Related U.S. Application Data application No. 14/804,913, filed on Jul. 21, 2015, now abandoned.

(51) Int. Cl.
*H01J 37/32* (2006.01)
*H01L 21/311* (2006.01)

(52) U.S. Cl.
CPC .. *H01J 37/32091* (2013.01); *H01J 37/32422* (2013.01); *H01J 37/3244* (2013.01); *H01J 37/32541* (2013.01); *H01J 37/32568* (2013.01); *H01J 37/32706* (2013.01); *H01J 37/32715* (2013.01); *H01L 21/3065* (2013.01); *H01L 21/31116* (2013.01); *H01J 2237/20214* (2013.01); *H01J 2237/3341* (2013.01)

(56) References Cited

U.S. PATENT DOCUMENTS

| | | | |
|---|---|---|---|
| 4,675,072 A | 6/1987 | Bennett | |
| 4,738,748 A | 4/1988 | Kisa | |
| 4,885,074 A | 12/1989 | Susko | |
| 5,356,476 A * | 10/1994 | Foster | C23C 16/14 118/724 |
| 5,981,899 A * | 11/1999 | Perrin | H01J 37/32541 219/121.48 |
| 6,028,615 A | 2/2000 | Pletcher | |
| 6,042,686 A | 3/2000 | Dible | |
| 6,779,482 B2 | 8/2004 | Sakai | |
| 6,930,047 B2 * | 8/2005 | Yamazaki | H01L 29/78624 257/E21.414 |
| 7,195,673 B2 | 3/2007 | Shimizu | |
| 7,268,083 B2 | 9/2007 | Ohkuni | |
| 7,886,690 B2 | 2/2011 | Ellingboe | |
| 8,636,872 B2 | 1/2014 | Matsuyama | |
| 2001/0017109 A1 * | 8/2001 | Liu | C23C 14/48 156/345.49 |
| 2004/0045673 A1 | 3/2004 | Yasui et al. | |
| 2005/0022740 A1 * | 2/2005 | Hatano | C23C 16/4405 118/723 E |
| 2005/0130620 A1 * | 6/2005 | Fischer | H01J 37/32532 455/333 |
| 2006/0281310 A1 | 12/2006 | Smith | |
| 2007/0074815 A1 | 4/2007 | Ohkuni | |
| 2007/0195482 A1 * | 8/2007 | Muka | H02N 13/00 361/234 |
| 2008/0119049 A1 | 5/2008 | Sung | |
| 2009/0078678 A1 * | 3/2009 | Kojima | H01L 21/31116 156/345.39 |
| 2010/0190350 A1 | 7/2010 | Yatsuda et al. | |
| 2012/0252220 A1 | 10/2012 | Harada | |
| 2013/0155075 A1 | 6/2013 | Matsui et al. | |
| 2013/0319854 A1 | 12/2013 | Parkhe | |
| 2014/0117834 A1 | 5/2014 | Yagi | |
| 2017/0169996 A1 | 6/2017 | Ui et al. | |

FOREIGN PATENT DOCUMENTS

| | | |
|---|---|---|
| JP | 2004-259832 A | 9/2004 |
| JP | 3816081 B2 | 8/2006 |
| JP | 2010-10417 A | 1/2010 |
| JP | 2010-171320 A | 8/2010 |
| JP | 2014-82449 A | 5/2014 |
| KR | 2014-0040640 A | 4/2014 |
| WO | WO-2012/173229 A1 | 12/2012 |

OTHER PUBLICATIONS

English machine translation of JP-2010-10417-A (Year: 2010).
Araki et al. (2012). "Prediction of Sheath Thickness and Ion Trajectory using On-wafer Monitoring and Simulation during Plasma processing." Japan Society of Applied Physics; 17-A7-3; p. 08-118.
Jae-Ho Min et al., "Interactive relationship between sidewall and bottom etch rates, as-affected by sidewall angle, during $SiO_2$ etching in a $CHF_3$ plasma", Journal of Vacuum Science & Technology B, Jul./Aug. 2006, pp. 1746-1754.
Notification of Reasons for Refusal mailed by the Japanese Patent Office on May 25, 2017 in Japanese Patent Application No. 2014-149241.
Notification of Reasons for Refusal mailed by the Korean Intellectual Property Office on Feb. 1, 2016 in Korean Patent Application No. 10-2015-0030207.

* cited by examiner

PLASMA PROCESSING APPARATUS AND PLASMA PROCESSING METHOD

CROSS REFERENCE TO RELATED APPLICATION

This application is a divisional of U.S. application Ser. No. 15/461,630, filed Mar. 17 2017 (pending), which is a division of application Ser. No. 14/804,913, filed Jul. 21, 2015 (now abandoned), which is based upon and claims the benefit of priority from Japanese Patent Application No. 2014-149241, filed on Jul. 22, 2014; the entire contents of which are incorporated herein by reference.

FIELD

Embodiments described herein relate generally to a plasma processing apparatus and a plasma processing method.

BACKGROUND

A plasma processing apparatus generates plasma, and makes ions in the plasma to be incident on a substrate (semiconductor wafer, for example), to thereby process the substrate. In a process of manufacturing a semiconductor device, when incident ions perform etching on a substrate, a trench, a via hole, a projecting portion and the like are formed.

Here, in the process of manufacturing the semiconductor device, it is important to perform fine control of processing shape, particularly vertical processing of a sidewall of trench for securing electrical performance of the semiconductor device.

However, it is not always easy to perform the fine control of processing shape, and it is usually the case that the sidewall of trench is not vertically formed, and is tapered, for example.

DETAILED DESCRIPTION

A plasma processing apparatus of an embodiment includes a chamber, an introducing part, a substrate electrode, a high-frequency power source, a low-frequency power source, and a switching mechanism. The introducing part introduces a process gas into the chamber. The substrate electrode is disposed in the chamber, a substrate is directly or indirectly mounted on the substrate electrode, and the substrate electrode includes a first and a second electrode elements alternately arranged. The high-frequency power source outputs a high-frequency voltage of 40 MHz or more for ionizing the process gas to generate plasma. The low-frequency power source outputs a low-frequency voltage of 20 MHz or less for introducing ions from the plasma. The switching mechanism applies the low-frequency voltage alternately to the first and the second electrode elements.

Hereinafter, embodiments will be described in detail with reference to the drawings.

First Embodiment

Figure 1:
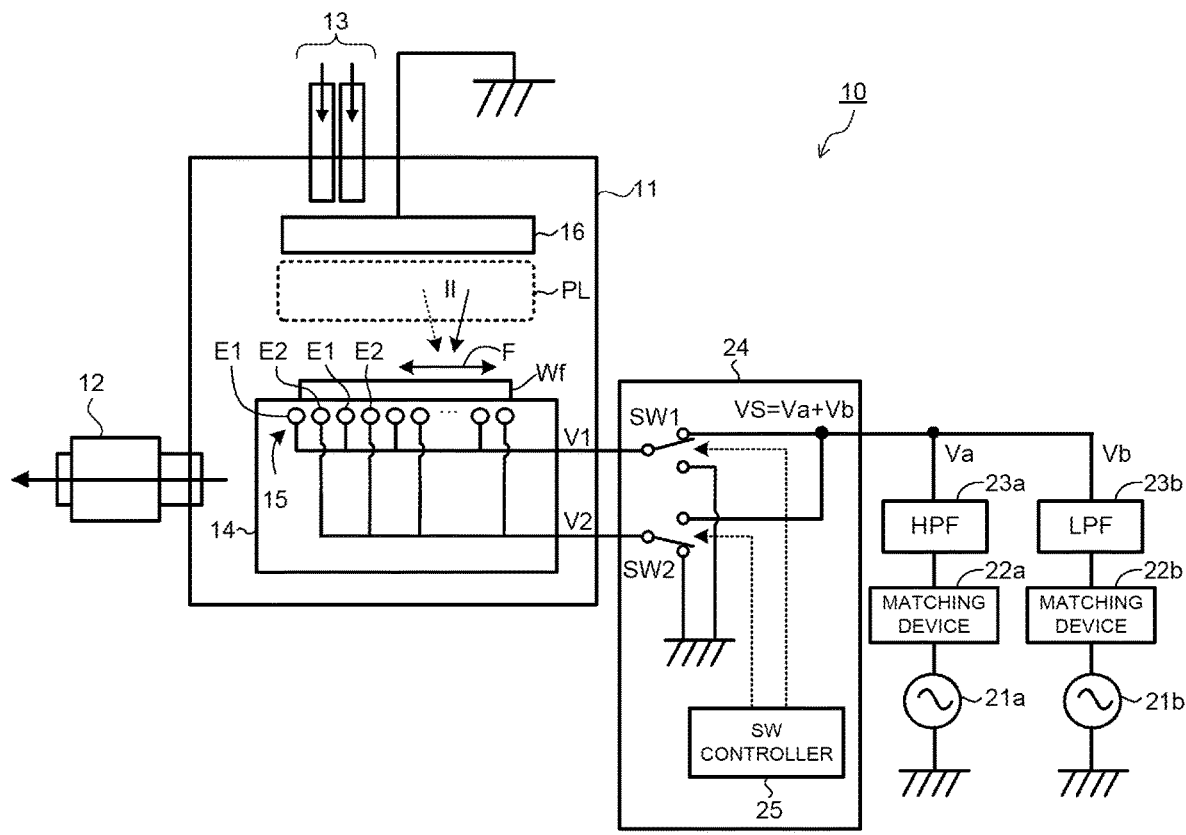
FIG. 1 is a schematic configuration diagram of a plasma processing apparatus 10 according to a first embodiment.

FIG. 1 is a schematic configuration diagram of a plasma processing apparatus 10 according to a first embodiment. The plasma processing apparatus 10 is a parallel plate type RIE (Reactive Ion Etching) apparatus.

The plasma processing apparatus 10 makes ions II in plasma PL to be incident on a wafer Wf to perform etching on the wafer Wf, thereby forming a trench, a via hole, a projecting portion and the like. The wafer Wf is a substrate, which is, for example, a substrate of semiconductor (Si, GaAs or the like).

The plasma processing apparatus 10 is common to an ion implantation apparatus that implants ions, in a point that the ions II are made to be incident on the wafer Wf, but, the both pieces of apparatus are different in the next point. In the plasma processing, an energy of incident ions is lower than that in the ion implantation (about 10 k to 500 keV in the ion implantation, and about 0 to 2000 eV in the plasma processing). When compared to the ion implantation, the plasma processing does not require a particular accelerator, and in the plasma processing, ions II from plasma PL are introduced by a bias potential applied to a substrate electrode 15. For this reason, the plasma PL and the substrate electrode 15 come close to each other in the plasma processing apparatus 10, when compared to those in the ion implantation (about 10 cm or more in the ion implantation, and about several cm or less in the plasma processing).

The plasma processing apparatus 10 has a chamber 11, an exhaust port 12, a process gas introduction pipe 13, a susceptor 14, a substrate electrode 15, a counter electrode 16, an RF high-frequency power source 21a, an RF low-frequency power source 21b, matching devices 22a and 22b, filters 23a and 23b, and a switching mechanism 24.

The chamber 11 maintains an environment required to perform processing on a wafer Wf.

The exhaust port 12 is connected to not-illustrated pressure regulating valve and exhaust pump. Gas in the chamber 11 is exhausted from the exhaust port 12, resulting in that the inside of the chamber 11 is maintained in a high-vacuum state. Further, when process gas is introduced from the process gas introduction pipe 13, a flow rate of gas flowed in through the process gas introduction pipe 13 and a flow rate of gas flowed out through the exhaust port 12 are balanced, resulting in that a pressure in the chamber 11 is kept constant.

The process gas introduction pipe 13 is an introducing part which introduces process gas required to perform processing on the wafer Wf, into the chamber 11. The process gas is used for forming plasma PL. By an electric discharge, the process gas is ionized to be turned into plasma PL, and ions II in the plasma PL are used for performing etching on the wafer Wf.

As the process gas, it is possible to appropriately use $SF_6$, $CF_4$, $C_2F_6$, $C_4F_8$, $C_5F_8$, $C_4F_6$, $Cl_2$, HBr, $SiH_4$, $SiF_4$ or the like, other than gas of Ar, Kr, Xe, $N_2$, $O_2$, CO, $H_2$ or the like.

Here, the process gas can be classified into deposition-type gas and depositionless-type gas. The depositionless-type gas is gas that performs only an etching operation when performing processing on the wafer Wf. On the other hand, the deposition-type gas performs not only the etching operation but also an operation of forming a coating film (protective film) when performing processing on the wafer Wf.

By using the deposition-type gas as the process gas, it is possible to improve a selection ratio of etching between an etching mask and an etching target (the wafer Wf or the like). Specifically, when the deposition-type gas is used, the etching proceeds during which a coating film is formed on the etching mask. As a result of this, an etching rate of the etching mask is reduced, and the selection ratio can be improved.

The classification of deposition type and depositionless type is not always an absolute one. Rare gas (Ar, Kr, Xe) does not perform the operation of forming the coating film almost at all, and thus it can be considered as pure depositionless-type gas, but, the other gas can perform the operation of forming the coating film in any way. Further, a magnitude relation between the etching operation and the operation of forming the coating film can be changed, based on a relation of a material and a shape of the etching mask and the etching target, a process pressure and the like.

Generally, Ar, Kr, Xe, $H_2$ and the like can be cited as the depositionless-type gas. Further, $C_2F_6$, $C_4F_6$, $C_4F_8$, $C_5F_8$, $SF_6$, $Cl_2$, HBr can be cited as the deposition-type gas. As an intermediate kind of gas between the deposition-type gas and the depositionless-type gas, there can be cited $N_2$, $O_2$, CO, and $CF_4$.

The susceptor 14 is a holding part holding the wafer Wf, and has a chuck for holding the wafer Wf. As the chuck, a mechanical chuck which dynamically holds the wafer Wf, or an electrostatic chuck that holds the wafer Wf with the use of an electrostatic force can be used. Note that explanation will be made on details of the electrostatic chuck in later-described modified example 6.

The substrate electrode 15 is an approximately plate-shaped electrode disposed on the susceptor 14 and having an upper surface which is close to or brought into contact with a lower surface of the wafer Wf. Specifically, the wafer Wf (substrate) is placed on the substrate electrode 15 indirectly (the both are close to each other) or directly (the both are brought into contact with each other).

Figure 2:
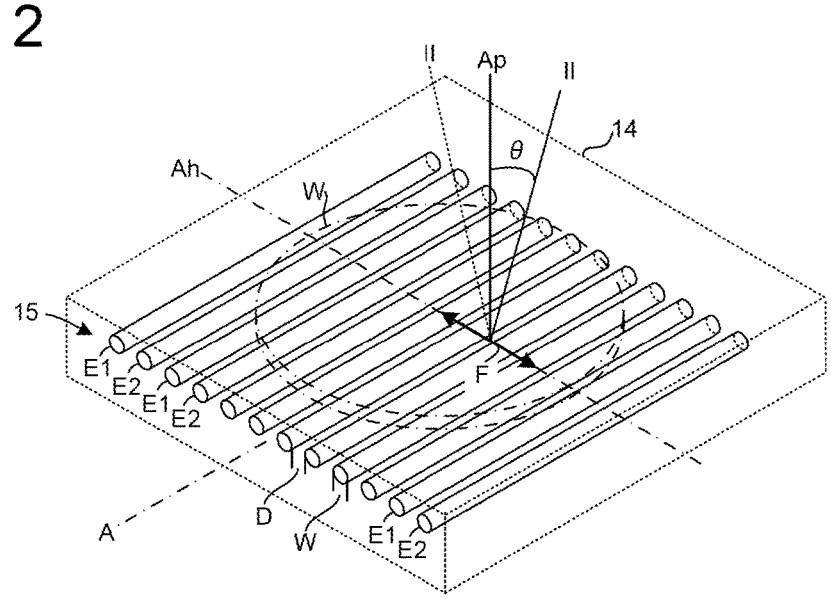
FIG. 2 to FIG. 4 are perspective views each illustrating one example of a configuration of a substrate electrode.

FIG. 2 is a perspective view illustrating one example of a configuration of the substrate electrode 15. As illustrated in FIG. 2, the substrate electrode 15 corresponds to divided electrodes formed by being divided in a plurality of pieces, and configured by two groups of electrode elements E1 and E2 (first and second electrode element groups) which are alternately arranged.

Here, each of the two groups of electrode elements E1 and E2 has a center axis along an axial direction A and an approximately column shape with a width (a width of each of the electrode elements E1 and E2, here, a diameter) W, and the electrode elements E1 and E2 are arranged in approximately parallel to each other with an interval D (a spatial distance between the electrode elements E1 and E2) provided therebetween. Note that the shape of each of the electrode elements E1 and E2 is not limited to the approximately column shape, and the shape may also be an approximately prism shape (approximately rectangular prism shape, for example).

At this time, it is preferable that the electrode interval D and the electrode width (the diameter, in this case) W are small to some degree (for example, the electrode interval D is set to 5 mm or less). As will be explained in later-described examples, an incident amount of ions II has a positional dependence. It can be considered that the incident amount of ions II varies in a period corresponding to the interval D and the electrode width W, by reflecting a periodic arrangement of the electrode elements E1 and E2. For this reason, by reducing the interval D and the electrode width W to some degree, the uniformity of plasma processing is improved (spatial period of variation in the incident amount of ions II is reduced).

Figure 3:
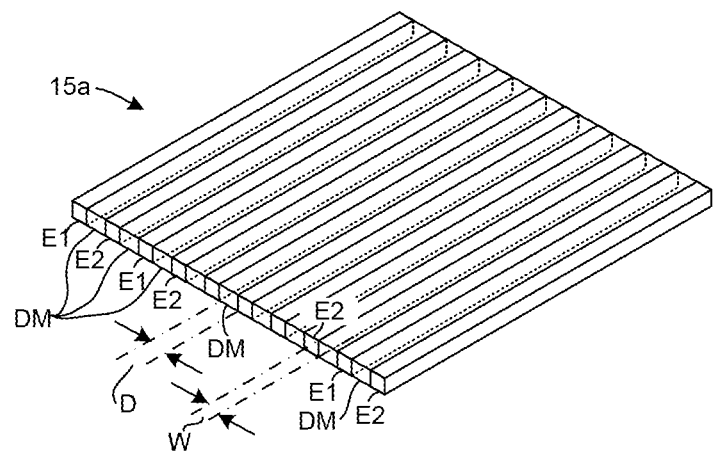

FIG. 3 is a perspective view illustrating another example of the configuration of the substrate electrode. A substrate electrode 15a has electrode elements E1 and E2, and dielectric members DM.

The dielectric member DM is arranged between the electrode elements E1 and E2. By the dielectric member DM, a voltage drop between the electrode elements E1 and E2, and between the substrate electrode 15 and the wafer Wf becomes small. As a result of this, a potential difference in a lateral direction is efficiently transmitted to the wafer Wf, which enables to secure an oblique component of electric field. In order to suppress the voltage drop, a dielectric constant of the dielectric member DM is preferably high. For example, it is possible to set the dielectric constant to 7.0 or more (7.7 of alumina)

Figure 4:
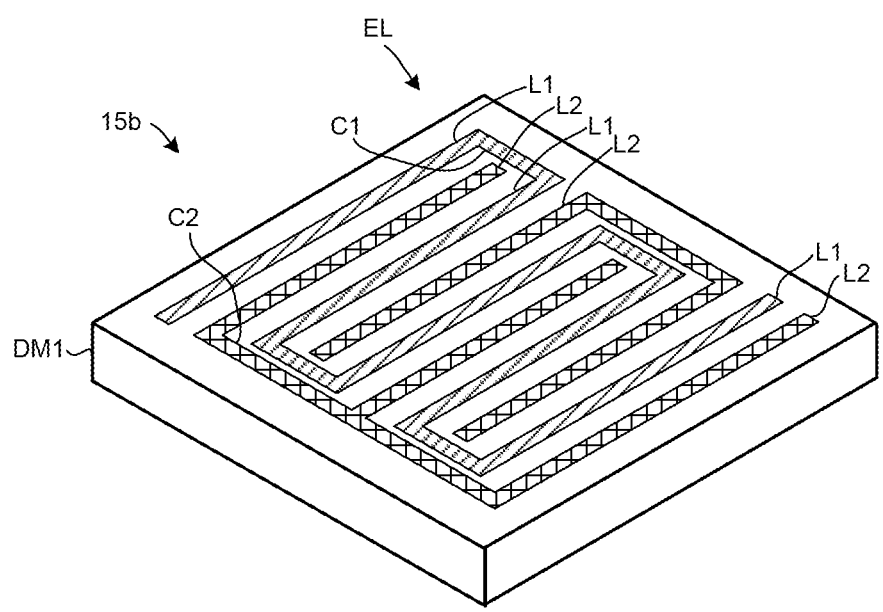

FIG. 4 is a perspective view illustrating another example of the configuration of the substrate electrode. A substrate electrode 15b has a dielectric member DM1, and a conductive layer EL. The conductive layer EL is disposed on the dielectric member DM1 having a plate shape. For example, the substrate electrode 15b can be formed from a printed circuit board.

The conductive layer EL has line patterns L1 and L2, and connecting portions C1 and C2. The line patterns L1 and L2 function as electrode elements E1 and E2, respectively. The connecting portions C1 and C2 electrically connect between the line patterns L1 and between the line patterns L2, respectively.

At this time, a thickness of the conductive layer EL is sufficient to be equal to or less than about 1 mm, for example. Even if the line patterns L1 and L2 are thin, the electric field in the lateral direction, namely, the oblique component of the electric field can be generated, similar to the case of using the electrode elements E1 and E2 each having a bar shape. This is because an electric field that contributes to the electric field in the lateral direction is not one caused by a potential in a thickness direction of the line patterns L1 and L2, but one caused by a potential difference between the adjacent line patterns L1 and L2.

The counter electrode 16 is disposed to face the substrate electrode 15 in the chamber 11, and one end thereof is set to a ground potential. The counter electrode 16 and the substrate electrode 15 form a parallel plate electrode.

The RF high-frequency power source 21a generates an RF high-frequency voltage Va which is applied to the substrate electrode 15. The RF high-frequency voltage Va is an alternating voltage of relatively high frequency which is used for generating plasma PL. A frequency fh of the RF high-frequency voltage Va is not less than 40 MHz nor more than 1000 MHz, and is more preferably not less than 40 MHz nor more than 500 MHz (100 MHz, for example).

The RF low-frequency power source 21b generates an RF low-frequency voltage Vb which is applied to the substrate electrode 15. The RF low-frequency voltage Vb is an alternating voltage of relatively low frequency used for introducing the ions II from the plasma PL. A frequency fl of the RF low-frequency voltage Vb is not less than 0.1 MHz nor more than 20 MHz, and is more preferably not less than 0.5 MHz nor more than 14 MHz (1 MHz, for example).

The matching devices 22a and 22b respectively match the impedance of the RF high-frequency power source 21a and the RF low-frequency power source 21b to that of the plasma PL and the like.

The filter 23a (HPF: High Pass Filter) prevents the RF low-frequency voltage Vb from the RF low-frequency power source 21b from being input into the RF high-frequency power source 21a.

The filter 23b (LPF: Low Pass Filter) prevents the RF high-frequency voltage Va from the RF high-frequency power source 21a from being input into the RF low-frequency power source 21b.

The switching mechanism 24 applies a voltage in which the voltage from the RF high-frequency power source 21a and the voltage from the RF low-frequency power source 21b are superposed (superposed voltage) VS to the electrode elements E1 and E2 in an alternate manner. As will be described later, since there is a difference in the voltages applied to the adjacent electrode elements E1 and E2, the ions II can be obliquely incident on the wafer Wf from the plasma PL.

The switching mechanism 24 has switches SW1 and SW2, and a SW controller 25.

Each of the switches SW1 and SW2 is a three-way switch, and selects to connect the electrode elements E1 and E2 to either the superposed voltage VS or a ground. The switches SW1 and SW2 function as first and second switches which switch the connection state of the electrode element groups E1 and E2 and the RF low-frequency power source 21b. As each of the switches SW1 and SW2, a vacuum relay can be used, for example.

The SW controller 25 is a switch controller controlling operations of the switches SW1 and SW2. When the SW controller 25 switches the switches SW1 and SW2, it is possible to apply the superposed voltage VS to the electrode elements E1 and E2 in an alternate manner. Further, the superposed voltage VS can be applied to both of the electrode elements E1 and E2 at the same time, or both of the electrode elements E1 and E2 can be grounded at the same time.

It is preferable that when the superposed voltage VS is applied to the electrode element E1, the electrode element E2 is grounded to a ground potential. This is for maintaining the potential difference between the electrode elements E1 and E2, and securing the oblique component of the electric field. If the electrode element E2 is not grounded (if the electrode element E2 is in a floating state where it is not connected to both of the superposed voltage VS and the ground) when the superposed voltage VS is applied to the electrode element E1, the potential of the electrode element E2 is influenced by the potential of the electrode element E1 adjacent to the electrode element E2, resulting in that the oblique component of the electric field becomes weak. However, since the oblique component of the electric field is generated even in this case, it is also possible to consider to design such that the electrode element E2 is temporarily set to be in the floating state when the superposed voltage VS is applied to the electrode element E1.

Hereinafter, a switching operation of the switches SW1 and SW2 will be described.

Figure 5:
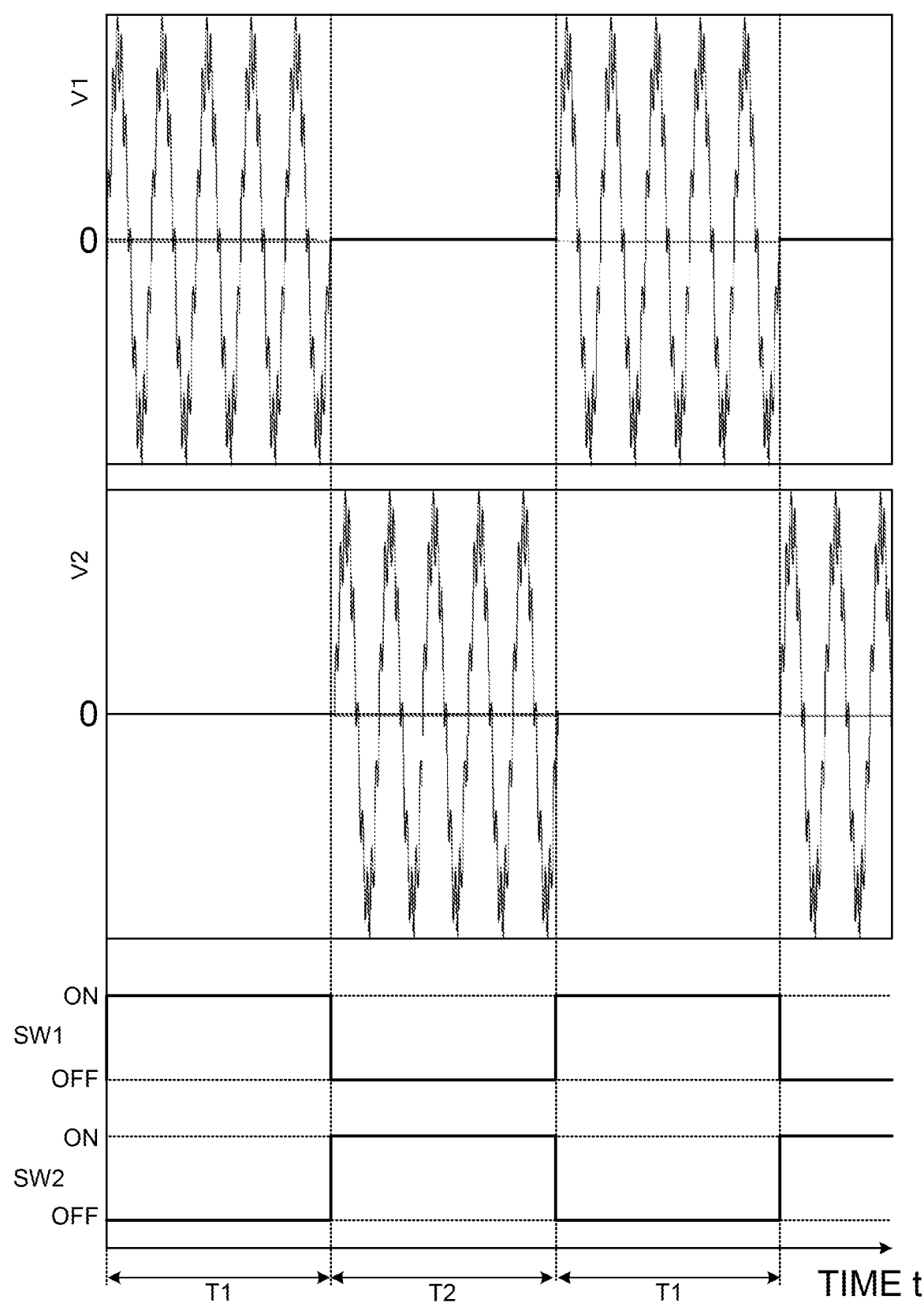
FIG. 5 is a diagram illustrating one example of voltage waveforms applied to electrode elements.

FIG. 5 illustrates one example of voltage waveforms V1 and V2 which are applied to the electrode elements E1 and E2, respectively. Here, the switches SW1 and SW2 are switched for every five periods of the RF low-frequency voltage Vb. Specifically, a time period (period) T1 in which only the voltage V1 becomes the superposed voltage VS, and a time period (period) T2 in which only the voltage V2 becomes the superposed voltage VS, are alternately repeated. The periods (switching periods) T1 and T2 are substantially the same (T).

It is also possible to design such that the switching period T (=T1, T2) is increased to be one corresponding to $10^8$ periods of the RF low-frequency voltage Vb, for example. When the frequency f1 of the RF low-frequency voltage Vb is 10 MHz, the switching period T becomes 10 seconds (=$10^8/(10*10^6)$).

A ratio between the switching period T and an oblique incidence process time Tp (T/Tp) is preferably about 0.001 to 0.5. It is more preferable that the ratio (T/Tp) is about 0.01 to 0.1 (specifically, the switching is performed about 10 times to 100 times during a process). This corresponds to a case where the switching period T is about 0.1 seconds to 3 seconds, when the oblique incidence process time Tp is assumed to be about several tens of seconds, for example, 30 seconds.

Here, for easier understanding, a phase at the time of switching the switches SW1 and SW2 and a phase of the RF low-frequency voltage Vb are set to be in a state of corresponding to each other. Actually, there is no need to make the phase at the time of switching the switches SW1 and SW2 and the phase of the RF low-frequency voltage Vb correspond to each other. Specifically, there is no need to set the switching period T to be an integral multiple of the period (=1/f1) of the RF low-frequency voltage Vb.

Here, the switching period T is set to be constant, but, it is also possible that the switching period T is temporally changed. As will be described later, it is also possible to change the switching period T based on a progress of the process, and a relation with a rotation speed Vr (reciprocal of rotation period Tr, Vr=1/Tr) of the substrate Wf to be described later.

In FIG. 5, it is set that the switching of ON and OFF is instantaneously conducted at a boundary between the periods T1 and T2, for easier understanding. However, strictly speaking, it is also possible to design such that the switching is not conducted instantaneously, but is conducted via a transition time ΔT of about 0.1 seconds, for example. Specifically, it is possible to provide, between the time periods T1 and T2, a time period (transition time ΔT) in which both of the switches SW1 and SW2 are ON. The plasma is securely maintained at the boundary between the switching periods T1 and T2, and further, the possibility of abnormal discharge at the time of the switching is reduced.

At this time, when the SW controller 25 controls the switches SW1 and SW2, states 1) to 4) are repeated, the states being as follows:

1) the state in which the electrode element group E1 is connected to the RF low-frequency power source 21b, and the electrode element group E2 is not connected to the RF low-frequency power source 21b;
2) the state in which both of the electrode element groups E1 and E2 are connected to the RF low-frequency power source 21b;
3) the state in which the electrode element group E1 is not connected to the RF low-frequency power source 21b, and the electrode element group E2 is connected to the RF low-frequency power source 21b; and
4) the state in which both of the electrode element groups E1 and E2 are connected to the RF low-frequency power source 21b.

As described above, it is also possible to provide the time (transition time ΔT), at the boundary between the switching periods T1 and T2, in which the voltage is applied to the electrode elements E1 and E2 at the same time. For example, a case where the RF low-frequency voltage Vb is applied to the electrode element E1 for $10^7$ periods (1 second) and then the switching is made, is considered. At this time, the voltage is started to be applied also to the electrode element E2 from 0.1 seconds ($10^6$ periods) before the switching. Further, a transition state in which the voltage is applied to both of the electrode elements E1 and E2, is created during the 0.1 seconds. After that, the application of voltage to the electrode element E1 is stopped, and the RF low-frequency voltage Vb is applied only to the electrode element E2.

During the transition time ΔT, the oblique component of the electric field is not generated. However, if the transition time ΔT is sufficiently short when compared to the time (time period T) during which the superposed voltage VS is applied only to one of the electrode elements E1 and E2, an influence of the presence/absence of the transition time ΔT exerted on the plasma processing can be ignored.

The 0.1 seconds of the transition time ΔT correspond to $10^6$ periods of the RF low-frequency voltage Vb whose frequency f1 is 10 MHz (=f*0.1=10*$10^6$*0.1).

Here, it is preferable that a ratio Rt between the transition time ΔT and the switching period T (=ΔT/T) is about 0.01 to 0.1. For example, when the RF low-frequency power source is switched for every 10 seconds, the transition time ΔT becomes 0.1 seconds to 1 second.

(Operation of Plasma Processing Apparatus 10)

In the chamber 11 in which an evacuation is conducted and a pressure reaches a predetermined pressure (0.01 Pa or less, for example), the wafer Wf is carried by a not-illustrated carrying mechanism. Next, the wafer Wf is held by the susceptor 14 with the use of the chuck. At this time, the substrate electrode 15 is close to or brought into contact with the wafer Wf.

Next, the process gas required to perform the processing on the wafer Wf is introduced from the process gas introduction pipe 13. At this time, the process gas introduced into the chamber 11 is exhausted at a predetermined rate from the exhaust port 12 by the not-illustrated pressure regulating valve and exhaust pump. As a result of this, the pressure in the chamber 11 is kept constant (about 1.0 to 6.0 Pa, for example).

Next, the RF high-frequency voltage Va from the RF high-frequency power source 21a, and the RF low-frequency voltage Vb from the RF low-frequency power source 21b are applied to the substrate electrode 15. The superposed voltage VS in which the RF high-frequency voltage Va and the RF low-frequency voltage Vb are superposed is applied to the electrode elements E1 and E2 in an alternate manner.

A density of the plasma PL is controlled by the RF high-frequency voltage Va from the RF high-frequency power source 21a. An incident energy of ions II which are incident on the wafer Wf is controlled by the RF low-frequency voltage Vb from the RF low-frequency power source 21b. The wafer Wf is etched by the ions II having an energy with a value which is equal to or greater than a threshold value in the etching processing of the wafer Wf.

Figure 6:
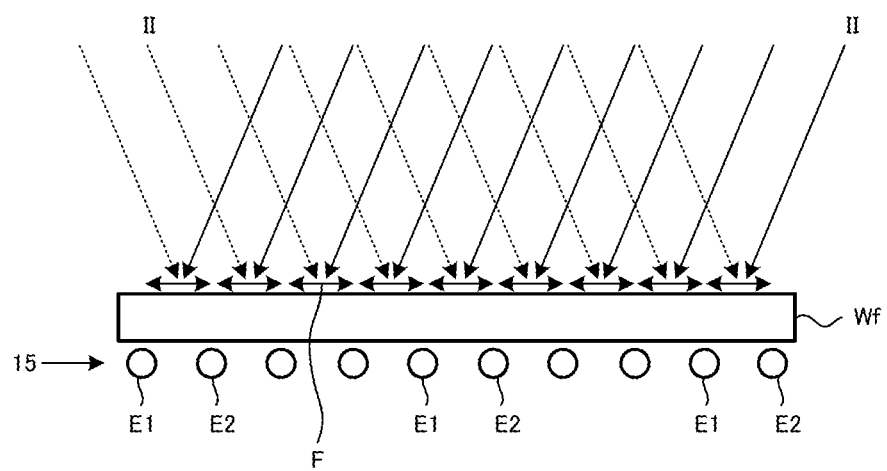
FIG. 6 is a schematic diagram illustrating one example of ions which are incident on a wafer.

FIG. 6 is a schematic diagram illustrating one example of ions II which are incident on the wafer Wf.

The superposed voltage VS in which the RF high-frequency voltage Va and the RF low-frequency voltage Vb are superposed is applied to the electrode elements E1 and E2 in an alternate manner. Here, a component of the RF high-frequency voltage Va does not exert a large influence on the introduction of ions, based on a relation of frequency. For this reason, it is possible to set such that the RF low-frequency voltage Vb is applied to the electrode elements E1 and E2 (substrate electrode 15) in an alternate manner.

When the RF low-frequency voltage Vb is applied between the substrate electrode 15 and the counter electrode 16, there is generated an electric field (vertical electric field) in a direction AP which is perpendicular to a plane of the substrate electrode 15 (wafer Wf) (refer to FIG. 2). As a result of this, the ions II in the plasma PL are introduced into the substrate electrode 15 (wafer Wf).

Here, the RF low-frequency voltage Vb is applied in an alternate manner, the potential between the adjacent electrode elements E1 and E2 is different. For this reason, there is generated an electric field F in a direction parallel to the plane of the substrate electrode 15 (wafer Wf) and parallel to a direction Ah which is orthogonal to the axial direction A of the electrode elements E1 and E2, in addition to the electric field in the vertical direction (refer to FIG. 2 and FIG. 6). As a result of this, by corresponding to the electric field F, the ions II are incident to have an incident angle θ (obliquely incident) with respect to the vertical direction. When the ions II are obliquely incident, it becomes possible to perform the etching on the wafer Wf with high precision. Note that details of this will be described later.

The electric field F varies in accordance with the period of the RF low-frequency voltage Vb. As a result of this, the incident angle θ of ions II periodically varies in accordance with the period of the RF low-frequency voltage Vb.

As described above, by performing the switching of the RF low-frequency voltage, the ion with the incident angle θ in the positive direction and the ion with the incident angle θ in the negative direction are alternately incident on the wafer Wf along the axial direction A. Specifically, in the present embodiment, the following becomes possible.

(1) The ions II can be obliquely incident on the wafer Wf at the incident angle θ. As will be described later, by using the obliquely incident ions II, it becomes possible to perform processing with high precision when forming the trench or the projecting portion, while reducing the taper.

In particular, when forming the trench or the projecting portion along the axial direction A, the amount of ions II which are incident on a sidewall of the trench or the like is increased, resulting in that the taper can be reduced. Specifically, it is preferable to make a direction of the trench or the projecting portion (direction of processing line on the wafer Wf) and the axial direction A of the electrode elements E1 and E2 coincide with each other.

(2) The ions II can be obliquely incident on both sides of the trench or the projecting portion along the axial direction A. As a result of this, it is possible to reduce the taper on both sidewalls of the trench.

COMPARATIVE EXAMPLE

Figure 7:
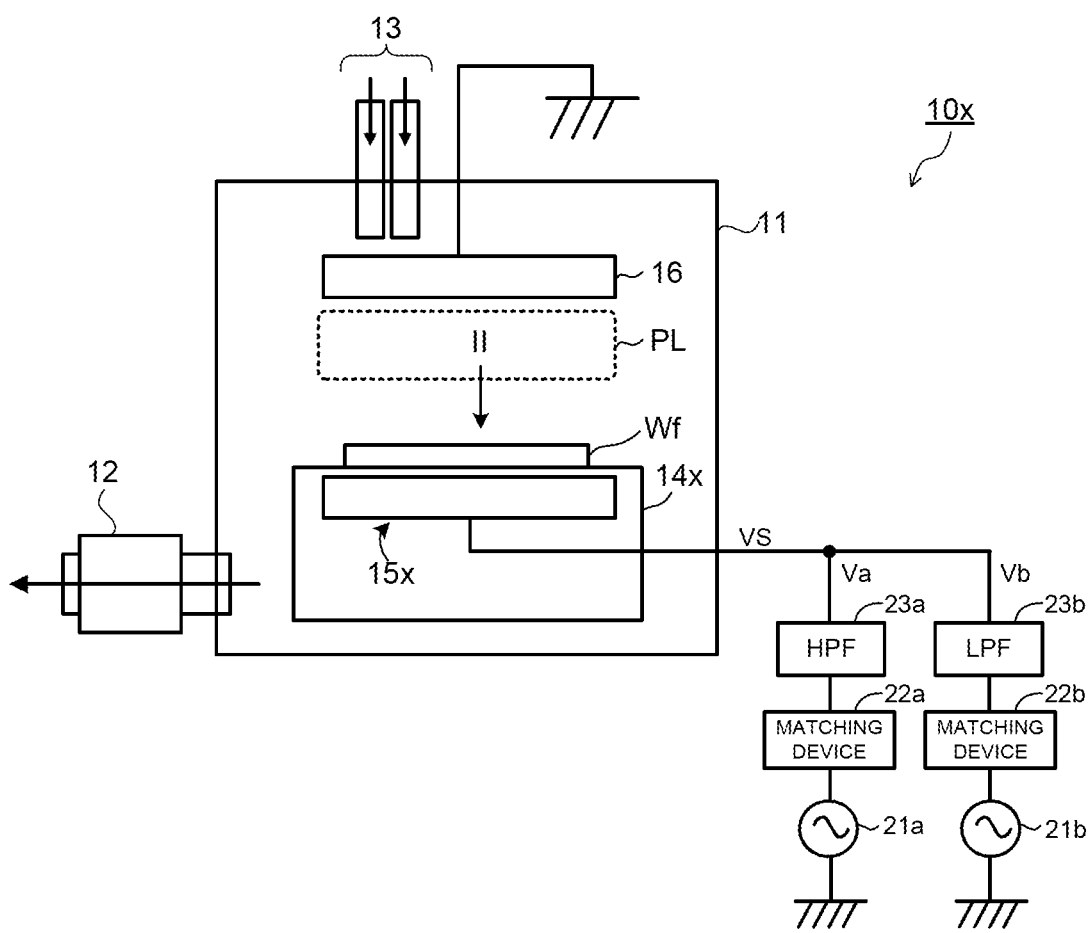
FIG. 7 is a schematic configuration diagram of a plasma processing apparatus 10x according to a comparative example.

FIG. 7 is a schematic configuration diagram of a plasma processing apparatus 10x according to a comparative example. The plasma processing apparatus 10x has the chamber 11, the exhaust port 12, the process gas introduction pipe 13, a susceptor 14x, a substrate electrode 15x, the counter electrode 16, the RF high-frequency power source 21a, the RF low-frequency power source 21b, the matching devices 22a and 22b, and the filters 23a and 23b.

The substrate electrode 15x is different from the substrate electrode 15, and has a plate shape with no electrode elements provided thereto (the substrate electrode 15x is not divided). The RF high-frequency voltage Va from the RF high-frequency power source 21a and the RF low-frequency voltage Vb from the RF low-frequency power source 21b are superposed to be applied to the substrate electrode 15x, which generates plasma PL and introduces ions II.

Since the substrate electrode 15x is not divided, in the plasma processing apparatus 10x, no electric field F parallel to the plane of the wafer Wf is generated. For this reason, the ions II are incident, from the plasma PL, only in a direction perpendicular to the plane of the wafer Wf, and basically, no ions II which are obliquely incident exist. As a result of this, it is difficult to perform precision processing using the obliquely incident ions II.

COMPARISON BETWEEN EMBODIMENT AND COMPARATIVE EXAMPLE

Hereinafter, a difference in the result of etching in the plasma processing apparatus 10 according to the embodiment and the plasma processing apparatus 10x according to the comparative example will be described.

Figure 8:
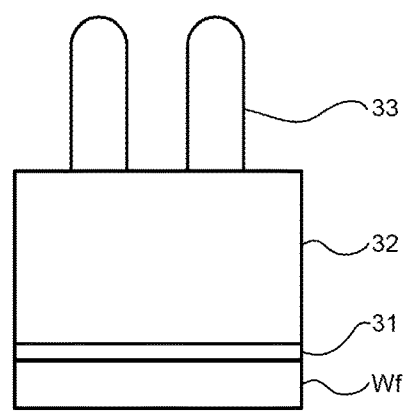
FIG. 8 is an enlarged sectional diagram illustrating a part of wafer before being subjected to processing in a plasma processing apparatus.

FIG. 8 is an enlarged sectional diagram illustrating a part of wafer Wf before being subjected to processing in a plasma processing apparatus. On the wafer Wf, layers 31 and 32, and a mask 33 are formed. Materials of the layers 31 and 32 are different materials, which are, for example, $SiO_2$ and Si. A material of the mask 33 is, for example, a resist or $SiO_2$, which is difficult to be etched, when compared to the layer 32.

Figure 9:
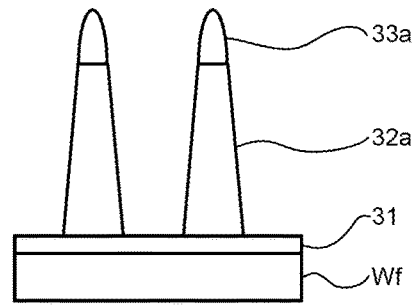
FIG. 9 to FIG. 11 are enlarged sectional diagrams each illustrating a state of wafer after being subjected to etching.
Figure 10:
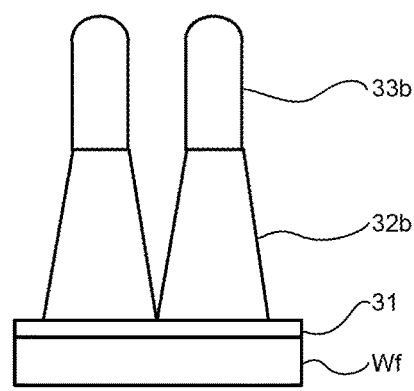

FIG. 9 and FIG. 10 are enlarged sectional diagrams each illustrating a state after such a wafer Wf is etched in the plasma processing apparatus 10x. FIG. 9 illustrates a case where the depositionless-type gas is used as the process gas, and FIG. 10 illustrates a case where the deposition-type gas is used as the process gas.

As illustrated in FIG. 9, when the depositionless-type gas is used as the process gas, since the selection ratio between the mask 33 and the layer 32 is small, an etching amount of the mask 33 is large, and it becomes difficult to perform precision processing on the layer 32.

As illustrated in FIG. 10, when the deposition-type gas is used as the process gas, the selection ratio between the mask 33 and the layer 32 becomes large, resulting in that the etching amount of the mask 33 becomes small. However, the layer 32 is easily etched in the oblique direction (the etched side surface is tapered). This is because a protective film is formed on the side surface due to the deposition-type gas, and meanwhile, the side surface is difficult to be subjected to the etching operation performed by ions II which are vertically incident. As described above, when the deposition-type gas is used, in particular, it is possible to increase the selection ratio, but, it is difficult to perform vertical processing (precision processing).

Further, the number of ions II which hit against the etched side surface (sidewall of trench) is small, so that a residue or adherent is easily deposited, which also makes it difficult to perform the precision processing.

Figure 11:
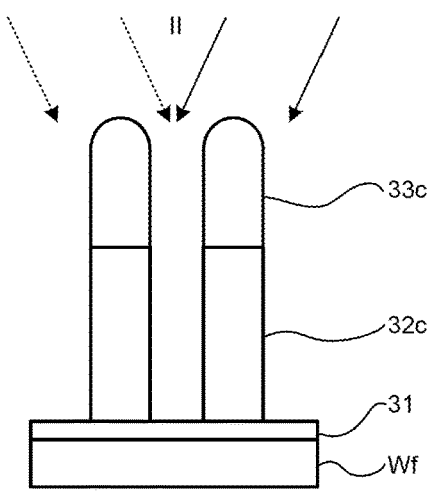

FIG. 11 is an enlarged sectional diagram illustrating a state after the wafer Wf is etched in the plasma processing apparatus 10. Here, a case where the deposition-type gas is used as the process gas, is illustrated. By using the deposition-type gas as the process gas, the selection ratio between the mask 33 and the layer 32 becomes large, resulting in that the etching amount of the mask 33 is small.

Further, the layer 32 is vertically etched (the etched side surface is not tapered). The ions II are obliquely incident on both sides of the etched side surface (sidewall of trench), so that the taper on the side surface is reduced.

Here, there is no need to use the obliquely incident ions II in all of the processes of the formation of trench. It is also possible that the ions II are vertically incident up to the middle of the formation of trench, and thereafter, the ions II are obliquely incident. Specifically, it is also possible that, in accordance with the progress of the plasma processing process, the switching period T of the low-frequency voltage Vb is changed, or the switching is stopped to apply the low-frequency voltage Vb to both of the electrode elements E1 and E2. Note that details thereof will be described in third and fourth embodiments.

As described above, in the present embodiment, the ions II can be obliquely incident on the wafer Wf at the incident angle B. As a result of this, it becomes possible to perform the precision etching processing in which the vertical processing on the sidewall is easily performed, and the residue is difficult to be remained on the sidewall.

MODIFIED EXAMPLE 1

Figure 12:
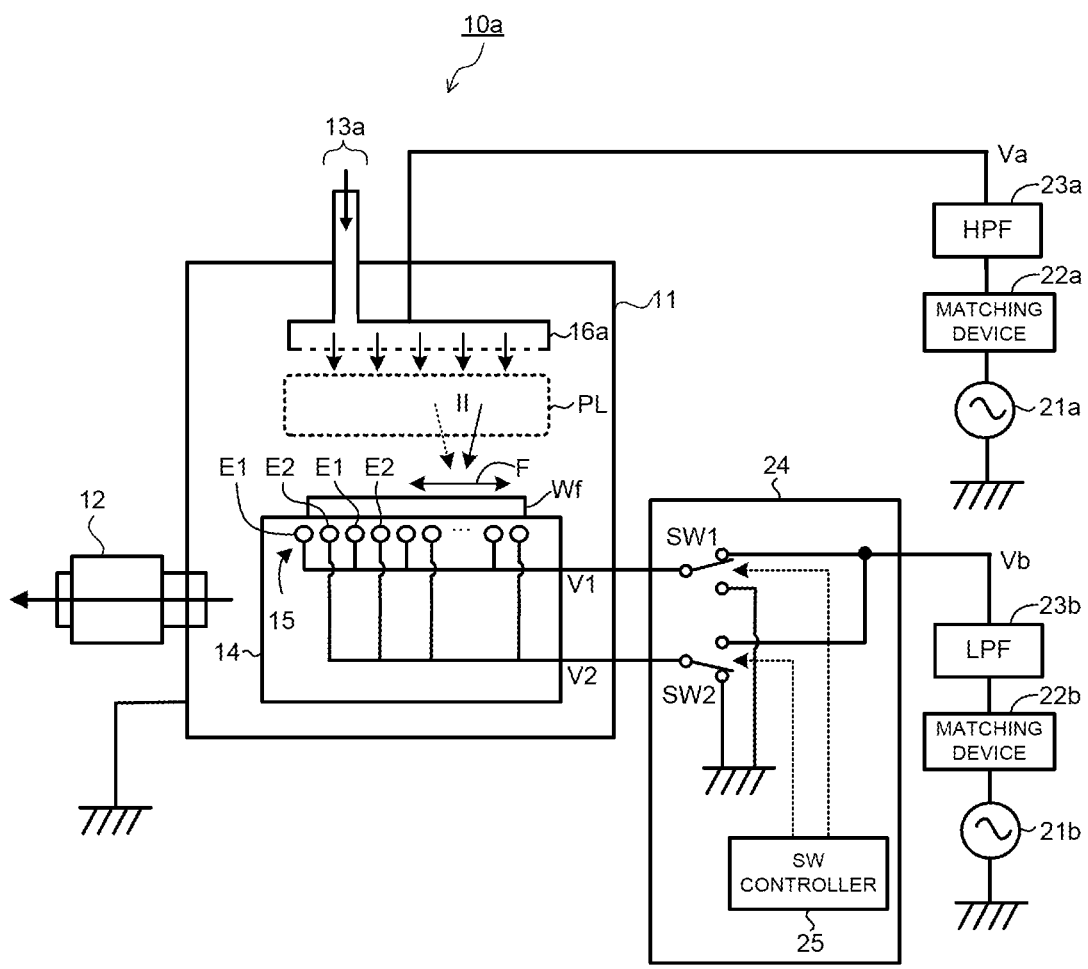
FIG. 12 is a schematic configuration diagram of a plasma processing apparatus 10a according to a modified example 1.

FIG. 12 is a schematic configuration diagram of a plasma processing apparatus 10a according to a modified example 1. The plasma processing apparatus 10a has the chamber 11, the exhaust port 12, a process gas introduction pipe 13a, the susceptor 14, the substrate electrode 15, a counter electrode 16a, the RF high-frequency power source 21a, the RF low-frequency power source 21b, the matching devices 22a and 22b, the filters 23a and 23b, and the switching mechanism 24.

The counter electrode 16a is a so-called showerhead, and has an internal space and a plurality of openings. Process gas is introduced from the process gas introduction pipe 13a to pass through the inside of the counter electrode 16a, and is then introduced into the chamber 11 from the plurality of openings of the counter electrode 16a. Specifically, the counter electrode 16a functions as an introducing part introducing the process gas into the chamber 11.

The modified example 1 is different from the first embodiment in that the RF high-frequency power source 21a is electrically connected not to the substrate electrode 15 but to the counter electrode 16a. Specifically, although the substrate electrode 15 rather serves to generate the plasma PL in the first embodiment, the counter electrode 16a serves to generate the plasma PL in the modified example 1. Further, a wall surface of the chamber 11 is grounded.

The modified example 1 is not largely different from the first embodiment in the other points, so that the other explanation thereof will be omitted.

MODIFIED EXAMPLE 2

Figure 13:
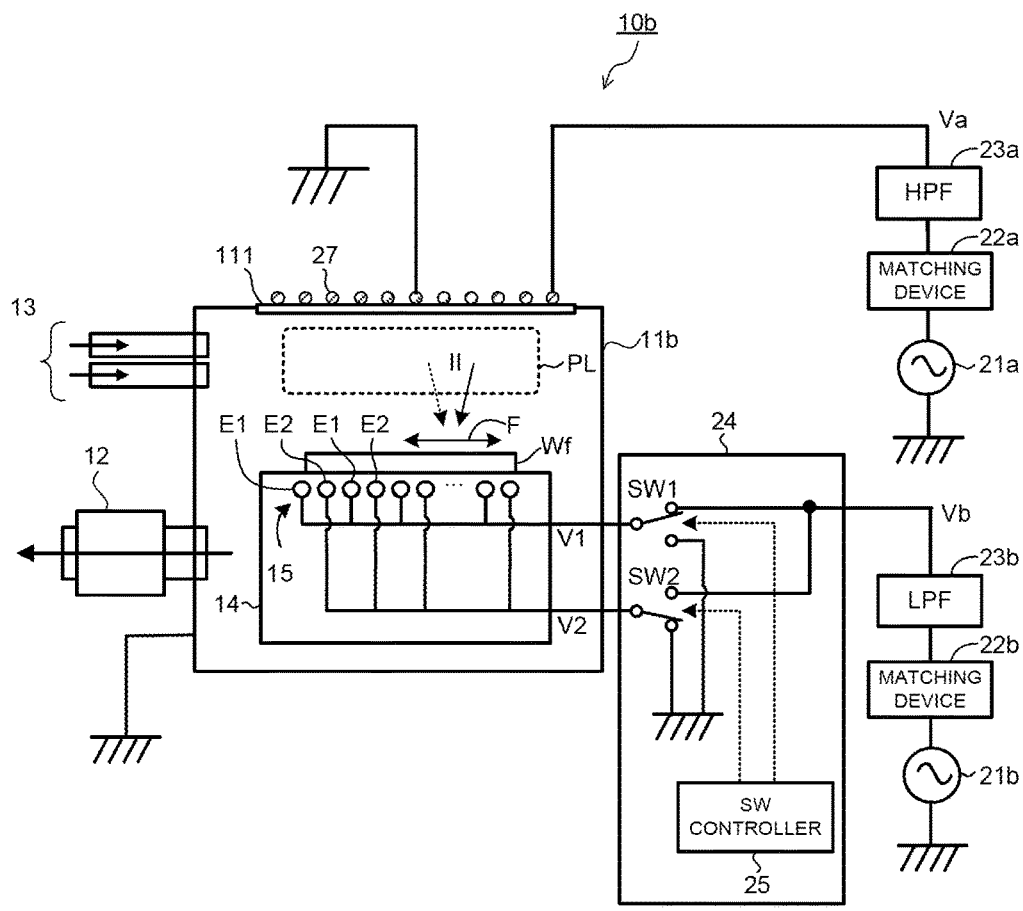
FIG. 13 is a schematic configuration diagram of a plasma processing apparatus 10b according to a modified example 2.
Figure 14:
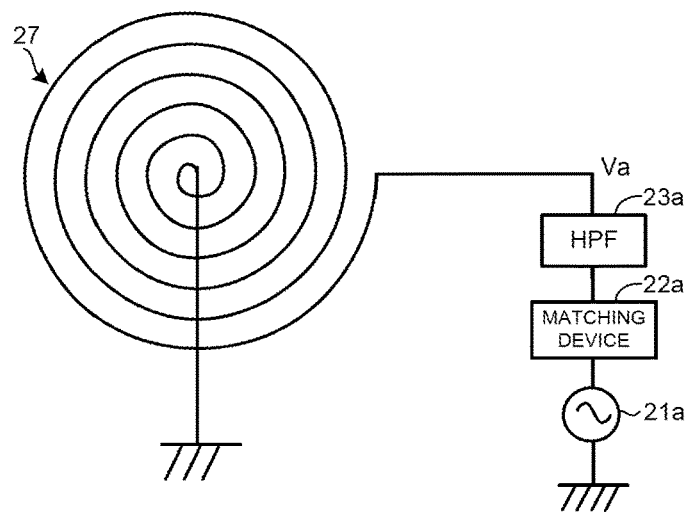
FIG. 14 is a schematic diagram illustrating an induction coil 27.

FIG. 13 is a schematic configuration diagram of a plasma processing apparatus 10b according to a modified example 2. The plasma processing apparatus 10b has a chamber 11b, the exhaust port 12, the process gas introduction pipe 13, the susceptor 14, the substrate electrode 15, the RF high-frequency power source 21a, the RF low-frequency power source 21b, the matching devices 22a and 22b, the filters 23a and 23b, the switching mechanism 24, a window 111, and an induction coil 27. FIG. 14 illustrates a state where the induction coil 27 is seen from the above in FIG. 13.

The plasma processing apparatus 10b is different from the plasma processing apparatus 10 in that it does not have the counter electrode 16 but has the window 111 and the induction coil 27.

The window 111 isolates the inside of the chamber 11b from the atmosphere, and a magnetic field from the induction coil 27 is passed through the window 111. As the window 111, a plate of nonmagnetic material such as quartz, for example, is used. The induction coil 27 is disposed on the outside of the chamber 11b. When the high-frequency voltage from the RF high-frequency power source 21a is applied to the induction coil 27, a varying magnetic field is generated, resulting in that the process gas in the chamber 11b is ionized, and the plasma PL is generated. Note that a wall surface of the chamber 11b is grounded.

The modified example 2 is not largely different from the first embodiment in the other points, so that the other explanation thereof will be omitted.

In each of the first embodiment and the modified examples 1 and 2, it is possible to ionize the process gas to generate the plasma, with the use of the RF high-frequency voltage Va of 40 MHz or more. Specifically, even in a case where the plasma PL is generated without applying the RF high-frequency voltage Va to the substrate electrode 15, as illustrated in the modified examples 1 and 2, it is possible to control the incident angle θ of the ions II by using the substrate electrode 15. Further, in the case of the modified examples 1 and 2, the electrodes are different, so that it is also possible to use an RF high frequency of 10 MHz or more.

Second Embodiment

Figure 15:
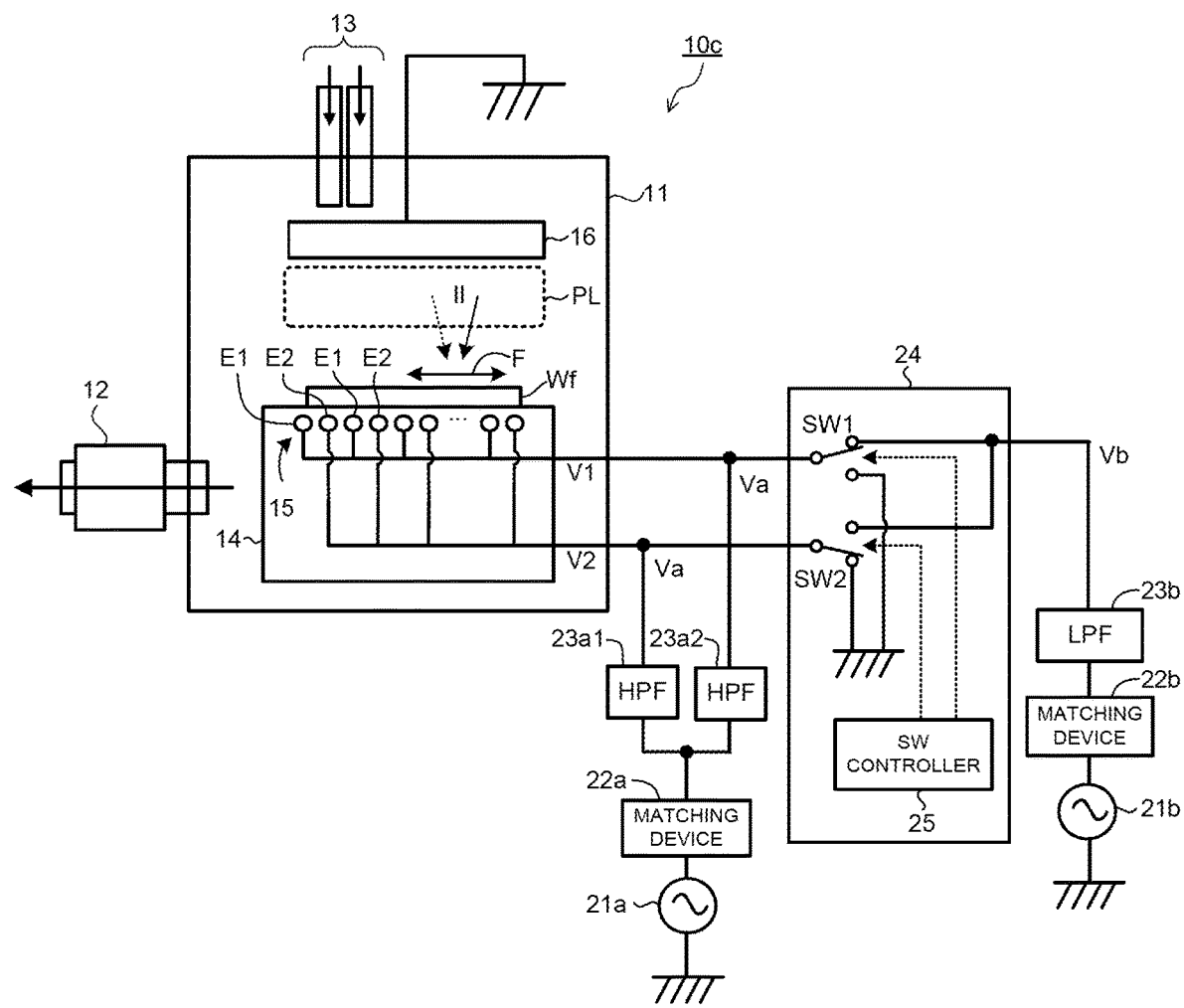
FIG. 15 is a schematic configuration diagram of a plasma processing apparatus 10c according to a second embodiment.

FIG. 15 is a schematic configuration diagram of a plasma processing apparatus 10c according to a second embodiment. The plasma processing apparatus 10c has the chamber 11, the exhaust port 12, the process gas introduction pipe 13, the susceptor 14, the substrate electrode 15, the counter electrode 16, the RF high-frequency power source 21a, the RF low-frequency power source 21b, the matching devices 22a and 22b, the filters 23a1, 23a2, and 23b, and the switching mechanism 24.

In the plasma processing apparatus 10, the on/off switching of both of the high-frequency voltage Va and the low-frequency voltage Vb is conducted.

In the plasma processing apparatus 10c, the high-frequency voltage Va is constantly applied to the electrode elements E1 and E2, and on the other hand, the low-frequency voltage Vb is applied to the electrode elements E1 and E2 in an alternate manner.

When the high-frequency voltage Va is kept applied, the density of plasma PL can be maintained to a high density, and the amount of incident ions II with respect to the substrate (wafer Wf) can be maintained to a large amount, when compared to that in the plasma processing apparatus 10. As described above, there is no need to perform the on/off switching of the high-frequency voltage Va, since the high-frequency voltage Va does not practically contribute to the introduction of ions.

The switching mechanism 24 switches and applies the RF low-frequency (LF) voltage Vb from the RF low-frequency power source 21b to the electrode elements E1 and E2, in an alternate manner. For example, the switching mechanism 24 applies the RF low-frequency voltage Vb to the electrode elements in the order of the electrode elements E1, E2, E1, and E2, for every 10 seconds.

Figure 16:
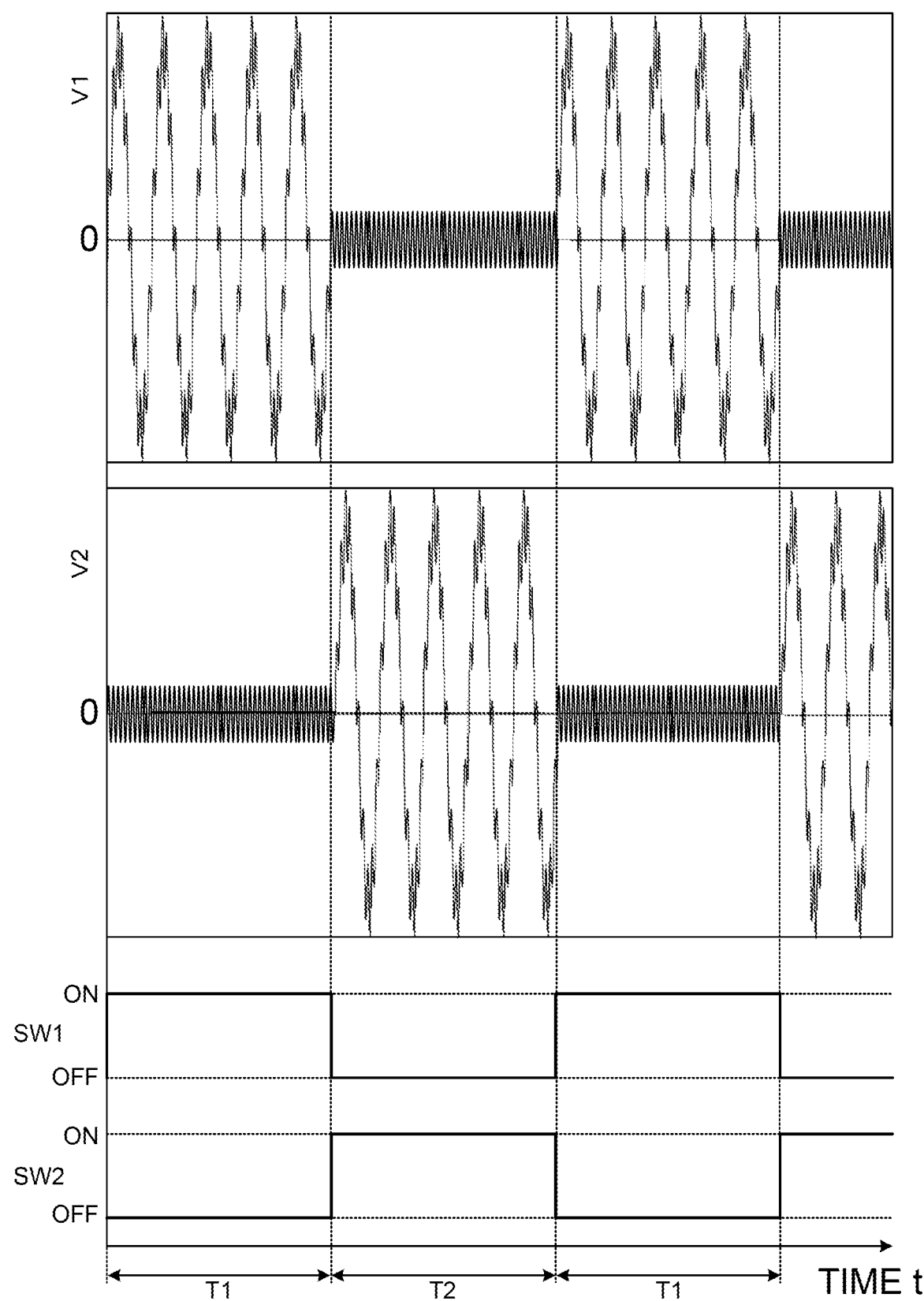
FIG. 16 is a diagram illustrating one example of voltage waveforms applied to electrode elements.

FIG. 16 is a diagram illustrating one example of voltage waveforms V1 and V2 applied to the electrode elements E1 and E2. The voltage waveforms V1 and V2 are respectively waveforms obtained by performing the on/off switching of the RF low-frequency voltage Vb.

In FIG. 16, it is set that the switching of ON and OFF is instantaneously conducted at the boundary between the periods T1 and T2, for easier understanding. However, it is also possible to provide the transition time ΔT between the time periods T1 and T2, as described above.

MODIFIED EXAMPLE 3

Figure 17:
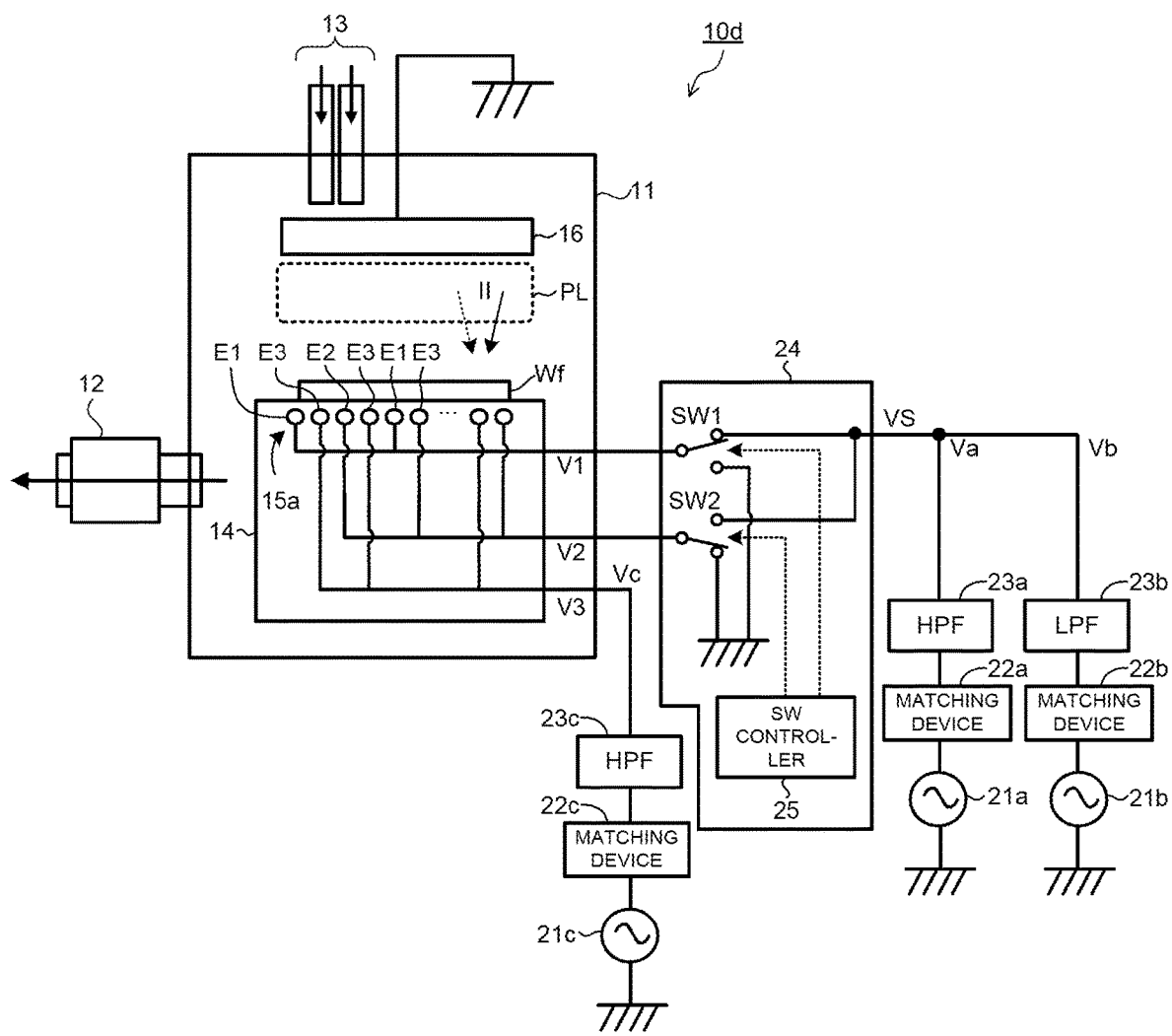
FIG. 17 is a schematic configuration diagram of a plasma processing apparatus 10d according to a modified example 3.

FIG. 17 is a schematic configuration diagram of a plasma processing apparatus 10d according to a modified example 3. The plasma processing apparatus 10d has the chamber 11, the exhaust port 12, the process gas introduction pipe 13, the susceptor 14, a substrate electrode 15a, the counter electrode 16, the RF high-frequency power source 21a, the RF low-frequency power source 21b, an RF high-frequency power source 21c, matching devices 22a, 22b, and 22c, filters 23a, 23b, and 23c, and the switching mechanism 24.

The substrate electrode 15a has electrode elements E1, E2, and E3. The electrode element E3 is arranged between the electrode elements E1 and E2. Specifically, the electrode elements E1, E3, E2, E3, E1, E3, E2, E3, E1, . . . are sequentially arranged.

The RF high-frequency power source 21c, the matching device 22c, and the filter 23c have functions corresponding to the functions of the RF high-frequency power source 21a, the matching device 22a, and the filter 23a, respectively.

The RF high-frequency power source 21c generates an RF high-frequency voltage Vc applied to the electrode element E3. Specifically, only the high-frequency voltage Vc for generating the plasma PL is applied to the electrode element E3.

The RF high-frequency voltage Vc is an alternating voltage of relatively high frequency which is used for generating the plasma PL. A frequency fh of the RF high-frequency voltage Vc is not less than 40 MHz nor more than 1000 MHz, and is more preferably not less than 40 MHz nor more than 500 MHz (100 MHz, for example).

The frequency of the RF high-frequency voltage Vc from the RF high-frequency power source 21c can be set to a frequency same as that of the RF high-frequency voltage Va from the RF high-frequency power source 21a. However, it is also possible that the frequencies of the RF high-frequency voltages Vc and Va are different.

The matching device 22c matches the impedance of the RF high-frequency power source 21c to that of the plasma PL and the like.

The filter 23c (HPF: High Pass Filter) prevents the RF low-frequency voltage Vb from the RF low-frequency power source 21b from being input into the RF high-frequency power source 21c.

In the modified example 2, the high-frequency voltage Va is kept applied to both of the electrode elements E1 and E2, and only the low-frequency voltage Vb is switched to be applied to the electrode elements E1 and E2.

On the contrary, in the present modified example, the electrode element E3 to which only the high-frequency voltage Vc for generating the plasma PL is applied, is further arranged between the electrode elements E1 and E2. By the high-frequency voltage Vc which is constantly applied to the electrode element E3, the density of the plasma PL is maintained to a high density, and a process rate is maintained.

Even if such a configuration is employed, the electric field F in the lateral direction is formed by a voltage difference among the adjacent electrode elements (substrate electrode) E1, E2, and E3, resulting in that the oblique incidence of ions II can be conducted.

Third Embodiment

Figure 18:
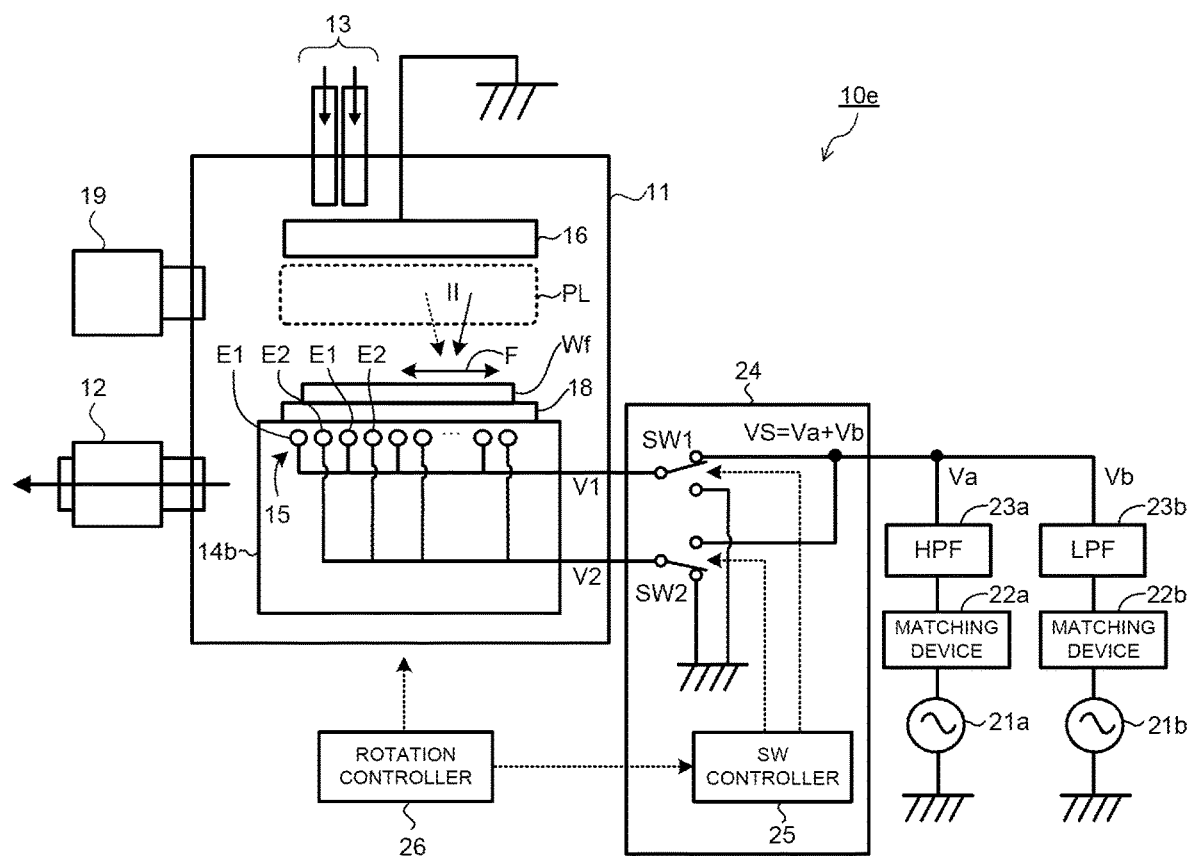
FIG. 18 is a schematic configuration diagram of a plasma processing apparatus 10e according to a third embodiment.

FIG. 18 is a schematic configuration diagram of a plasma processing apparatus 10e according to a third embodiment. The plasma processing apparatus 10e has the chamber 11, the exhaust port 12, the process gas introduction pipe 13, a susceptor 14b, the substrate electrode 15, the counter electrode 16, a wafer rotating mechanism 18, a termination detector 19, the RF high-frequency power source 21a, the RF low-frequency power source 21b, the matching devices 22a and 22b, the filters 23a and 23b, the switching mechanism 24, and a rotation controller 26.

In this case, the superposed voltage VS in which the voltages Va and Vb are superposed is applied to the substrate electrode 15 (electrode elements E1 and E2) in an alternate manner, similar to the plasma processing apparatus 10. On the contrary, it is also possible to appropriately change a combination of the voltages Va, Vb, and Vc applied to the substrate electrode 15 and the counter electrode 16, as described in the second embodiment and the modified examples 1 to 3.

When compared to the plasma processing apparatus 10, to the plasma processing apparatus 10e, the wafer rotating mechanism 18, the termination detector 19, and the rotation controller 26 are added.

The wafer rotating mechanism 18 relatively rotates the wafer Wf with respect to the substrate electrode 15, to thereby change a direction of the wafer Wf with respect to the axial direction A of the electrode elements E1 and E2 of the substrate electrode 15. The rotation may be either a temporary rotation or a continuous rotation, and can be changed in accordance with the progress of the process.

Further, it is also possible to design such that in accordance with the progress of the process, the switching mechanism 24 changes the period (switching period T) in which the voltage is applied to the electrode element groups E1 and E2 in an alternate manner, or stops the alternate application to apply the voltage to both of the electrode element groups E1 and E2. For example, after performing processing with the use of a vertical incidence for one minute, it is possible to perform processing with the use of an oblique incidence for 10 seconds as finish processing for adjusting a shape. When the vertical incidence of ions is performed, the superposed voltage VS is applied to all of the electrode elements E1 and E2. When the oblique incidence of ions is performed, the superposed voltage VS is applied while switching the electrode elements E1 and E2.

At this time, a progress state of the process can be grasped by a detector such as the termination detector 19. Further, it is also possible to control the progress state of the process according to time, without using such a detector. This similarly applies to the other embodiments as well.

Further, a combination of the switching period T and the rotation speed Vr can employ various patterns. For example, the rotation speed Vr can be set to 10 rotations per second. The rotation speed Vr in this case is 600 rpm. The wafer may be rotated at a speed faster or slower than the above rotation speed. The switching of the RF low-frequency voltage can be performed once per second, for example. The switching may be performed at a speed faster or slower than the above speed.

The termination detector 19 detects the termination of etching, based on a change in emission spectrum of the plasma PL, for example. When composing materials of the layers 32 and 31 are different, the emission spectrum of the plasma PL is changed due to the difference in these composing materials, resulting in that the termination of etching of the layer 32 (exposure of the layer 31) can be detected.

The rotation controller 26 controls the wafer rotating mechanism 18, and the switching mechanism 24 in accordance with the transition of process (detection result in the termination detector 19 or time shift).

(1) The rotation controller 26 can control the wafer rotating mechanism 18 in a manner as in the following a) and b).

a) The wafer Wf is rotated so that the direction of trench and the axial direction A of the electrode elements E1 and E2 illustrated in FIG. 2 coincide with each other (the directions are approximately parallel to each other). By performing, after that, the plasma processing, it is possible to improve the processing precision of the trench.

b) The wafer Wf is continuously rotated during the plasma processing. By designing as above, it is possible to improve the processing precision without depending on the direction of trench. Specifically, the precision processing and vertical processing of a sidewall of via hole are realized.

Figure 19:
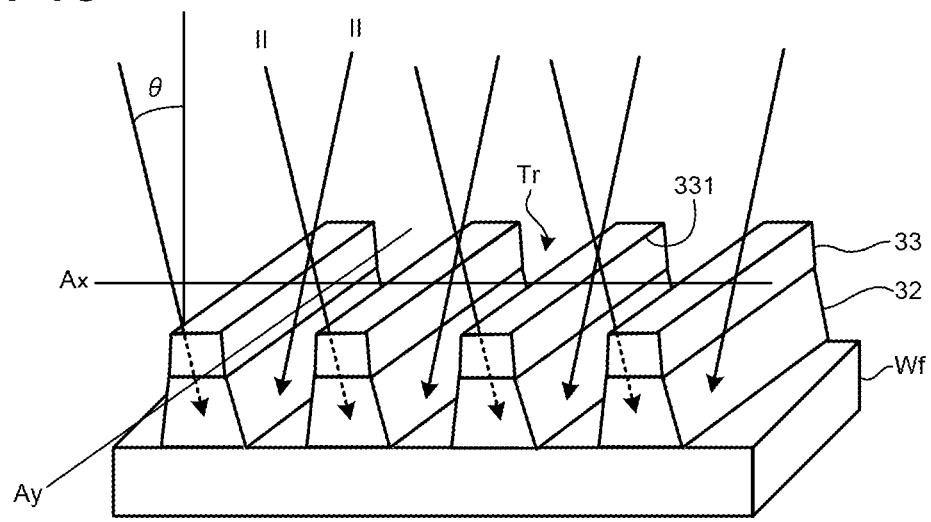
FIG. 19 is a diagram illustrating a state of performing processing on sidewalls of trenches.
Figure 20:
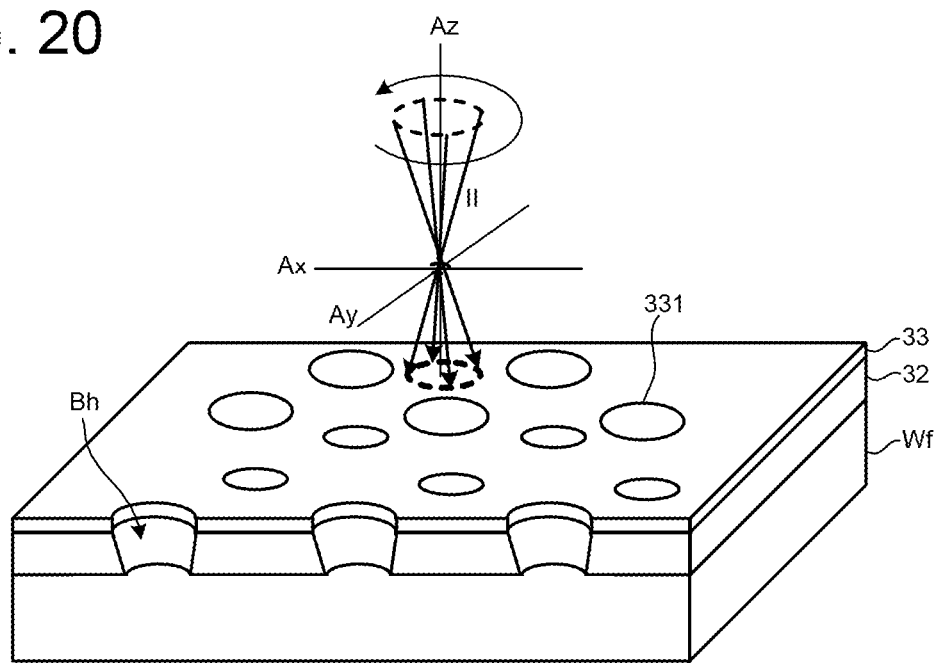
FIG. 20 is a diagram illustrating a state of performing processing on a sidewall of via.
Figure 21A:
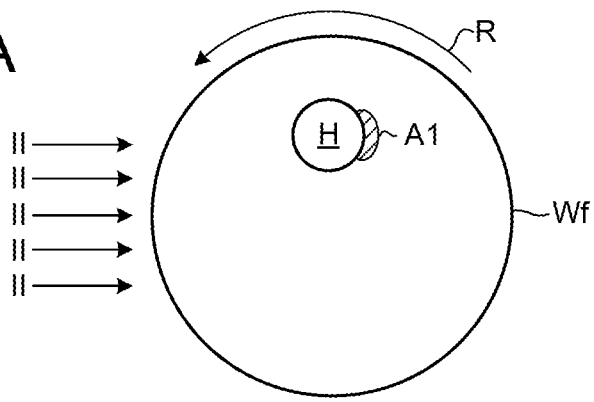
FIG. 21A to FIG. 21D are schematic diagrams each illustrating a state of performing processing while rotating a wafer.
Figure 21B:
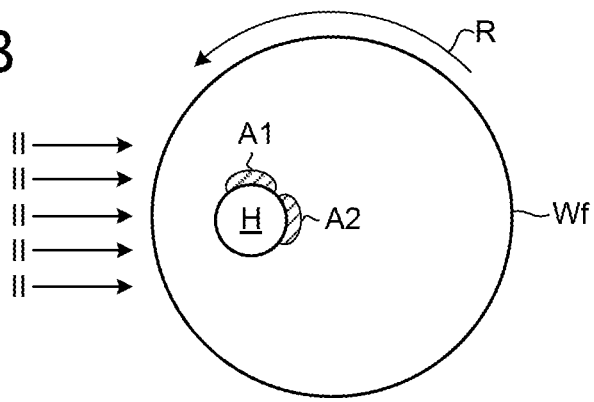
Figure 21C:
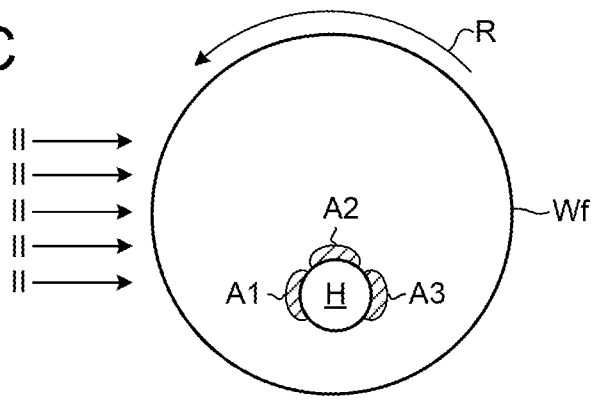
Figure 21D:
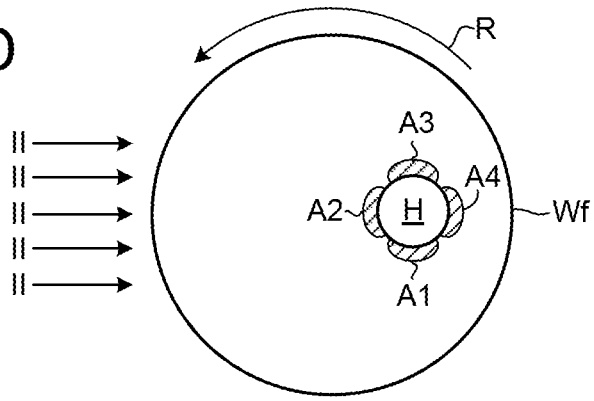
Figure 22A:
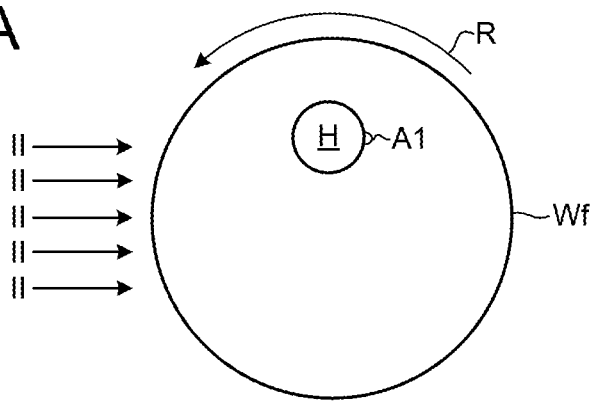
FIG. 22A to FIG. 22D are schematic diagrams each illustrating a state of performing processing while rotating the wafer.
Figure 22B:
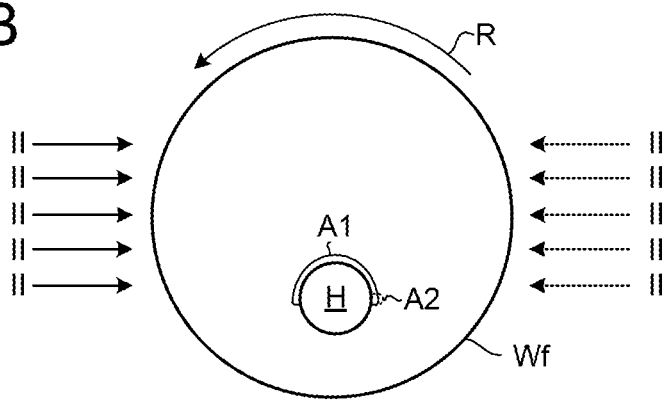
Figure 22C:
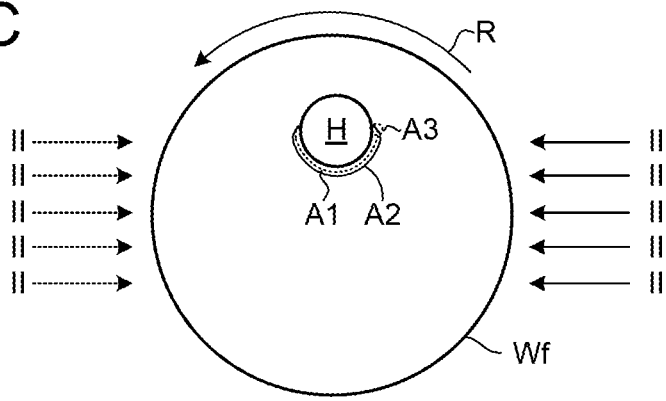
Figure 22D:
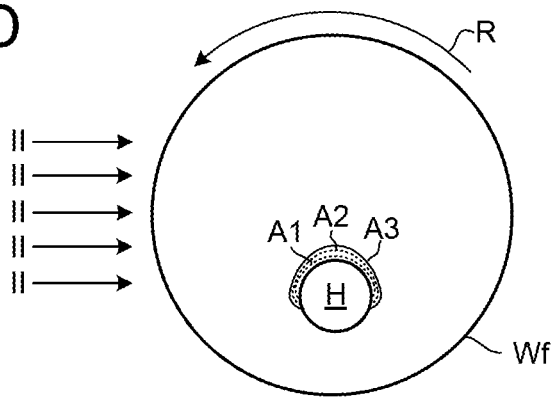

FIG. 19 illustrates a state where sidewalls of trenches are processed, and FIG. 20 illustrates a state where a sidewall of via is processed. The layer 32 and the mask 33 are formed on the wafer Wf. In FIG. 19, the mask 33 has a plurality of rectangular openings 331 along an axis Ay. In FIG. 20, the mask 33 has a plurality of circular openings 331.

By making the ions II to be incident from above the wafer Wf, a trench Tr is formed in FIG. 19, and a via hole Bh is formed in FIG. 20. Basically, the trench Tr is formed in FIG. 19, and the via hole Bh is formed in FIG. 20 due to the difference in shapes of the openings 331 formed on the mask 33.

Here, it is set that the wafer Wf is not rotated in FIG. 19, by corresponding to the first and second embodiments. On the other hand, it is set that the wafer Wf is rotated in FIG. 20, by corresponding to the third embodiment. Further, it is set that in FIG. 19, the axis Ay coincides with the axis of the electrode element E illustrated in FIG. 2 and FIG. 3.

At this time, in FIG. 19, the incident angle θ of the ions II is changed in which the axis Ay is set as a rotation axis. As a result of this, the ions II are efficiently incident on the sidewall of the trench Tr. As described above, in order to efficiently form the trench Tr, it is preferable that the axis of the opening 331 of the trench Tr and the axis of the electrode element E are made to coincide with each other, and the wafer Wf is not rotated.

On the contrary, in FIG. 20, the wafer Wf is rotated, and the incident angle of the ions II with respect to the axis Ax and that with respect to the axis Ay are symmetric (the ions II are obliquely incident from all directions). As a result of this, it is possible to easily form the via holes Bh symmetric with respect to a vertical axis Az of the wafer Wf. As described above, in order to form the via hole Bh with good shape, it is preferable to rotate the wafer Wf.

Note that, as will be described in later-described fifth embodiment, a similar effect can be achieved by rotating the electric field without changing a relative angle between the wafer Wf and the substrate electrode 15.

(2) The rotation controller 26 can control the switching mechanism 24 in the following manner.

The RF low-frequency voltage Vb from the RF low-frequency power source 21b is applied to the respective electrode elements of the substrate electrode 15 without performing the switching, up to the middle of the formation of the trench, to thereby realize the vertical incidence. Thereafter, the RF low-frequency voltage Vb is applied while being switched. Specifically, the switching mechanism 24 is controlled in accordance with the progress of the plasma processing process, and the incident direction of the ions II is switched from the direction of vertical incidence to the direction of oblique incidence.

By designing as above, it becomes possible to realize both of the securement of etching rate in a depth direction when the vertical incidence occurs and the reduction in taper when the oblique incidence occurs. The etching rate when the oblique incidence occurs is smaller than that when the vertical incidence occurs. This is because, when the oblique incidence occurs, an area on the wafer Wf on which the ions are incident becomes large, and the number of incident ions per unit area is reduced, when compared to the time in which the vertical incidence occurs.

Note that for switching the time when the vertical incidence occurs and the time when the oblique incidence occurs, the detection of termination of etching of the layer 32 detected by the termination detector 19, the passage of predetermined processing time, or a timing adjustment with the switching period T can be utilized.

Hereinafter, an example of processing process of a hole H using the rotation of the wafer Wf and the RF switching, will be described.

First, a progress of the processing of the hole H on the wafer Wf when the wafer Wf is rotated, will be described. At this time, it is set that the RF switching is not conducted.

As illustrated in FIG. 21A to FIG. 21D, it is set that in an initial switching period T1, the voltage is applied to the electrode element E1, and the irradiation of ions II with oblique components in a direction of arrow marks (right direction in the drawings) occurs. The hole H on the wafer Wf is also rotated together with the wafer Wf, and sidewalls (etching areas A1 to A4) of the hole H are sequentially and uniformly etched in a circumferential direction (FIG. 21A to FIG. 21D). The wafer in the state where the ions are incident in the obliquely right direction is repeatedly rotated an integer number of times (rotated 100 times, for example). Here, when the rotation period Tr is set to 0.1 seconds, the switching period T1 becomes 10 seconds.

Next, as a transition state before switching the voltage, the voltage is applied to both of the electrode elements E1 and E2, and the wafer is rotated several times (rotated 10 times, for example) in the state where the ions are vertically incident. Note that it is also possible that a state where the voltage is not applied to both of the electrode elements E1 and E2, and no etching is performed, is set as the transition state. When the rotation period Tr is 0.1 seconds, the transition time ΔT becomes 1 second.

It is set that in the next switching period T2, the voltage is applied to the electrode element E2, and ions with oblique components in a direction opposite to that of the arrow marks (left direction in the drawings) are generated. Similarly, also in this case, the process uniformity in the circumferential direction is maintained during the rotation (not illustrated). Further, during the switching period T2 (in which the wafer is rotated integer number of times same as that of the switching period T1 and a time same as that of the switching period T1 is provided), the ions II with oblique components in the direction of arrow mark in the left direction (not illustrated) are irradiated.

Thereafter, in accordance with the process, by repeating the transition time ΔT, the switching period T1, the transition time ΔT, the switching period T2 (for example, 1 second, 10 seconds, 1 second, 10 seconds), . . . , the hole H on the wafer is uniformly etched in the circumferential direction.

The switching periods T1 and T2, and the transition time ΔT may also be changed in the middle of the process. Although the switching periods T1 and T2 do not necessarily have to be the same, basically, a nearly equal period of time is assumed as the switching periods T1 and T2.

By setting each of the switching periods T1 and T2, and the transition time ΔT to one corresponding to the integer number of times of rotation of the wafer Wf, it is possible to simplify the relation of the rotation speed Vr and the switching periods T1 and T2.

Note that the switching periods T1 and T2 do not necessarily have to correspond to the integer number of times of rotation. Specifically, it is also possible to change, in the middle of one rotation of the wafer Wf, the state where the ions are incident in the obliquely right direction (T1) and the state where the ions are incident in the obliquely left direction (T2). However, in this case, there is a need to adjust the rotation speed Vr and a timing of the switching. Depending on a relation of these, the process uniformity in the circumferential direction is not always achieved.

The following a) to c) describe some examples.

a) Case where the switching period T (T1, T2) is 0.5n times the rotation period Tr (refer to FIG. 22A to FIG. 22D)

The case where the switching period T is 0.5n (n= 1, 3, 5, . . . odd number) times the rotation period Tr is considered. Here, concretely, a case where the state where the ions are incident in the obliquely right direction and the state where the ions are incident in the obliquely left direction are switched for every ½ rotations, is considered.

FIG. 22A to FIG. 22D illustrate states where the wafer Wf makes 0 rotation, 0.5 rotations, 1.0 rotation, and 1.5 rotations, respectively. The state where the wafer Wf makes 1.5 rotations in FIG. 22D shifts to a state where the wafer Wf makes 2.0 rotations corresponding to FIG. 22A. FIG. 22A to FIG. 22B, FIG. 22B to FIG. 22C, and FIG. 22C to FIG. 22D correspond to the switching periods T1, T2, and T1, respectively. Specifically, at a moment illustrated in FIG. 22A to FIG. 22D, the direction of ions II is switched from the left to the right, or from the right to the left.

In the switching periods T1, T2, and T1, the areas A1, A2, and A3 are etched, respectively.

In the switching period T1 (when ions in the right direction are irradiated), the wafer Wf makes a half rotation, and thereafter, the switching period T2 (irradiation of ions in the left direction) is started. In this case, the same sides (the areas A1 and A2) of the hole H are shaved in both of the first-half rotation and the last-half rotation. This causes a non-uniform etching, which is not favorable.

Figure 23A:
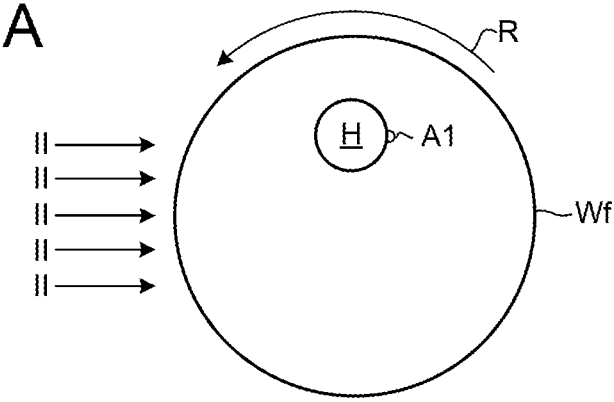
FIG. 23A to FIG. 23C are schematic diagrams each illustrating a state of performing processing while rotating the wafer.
Figure 23B:
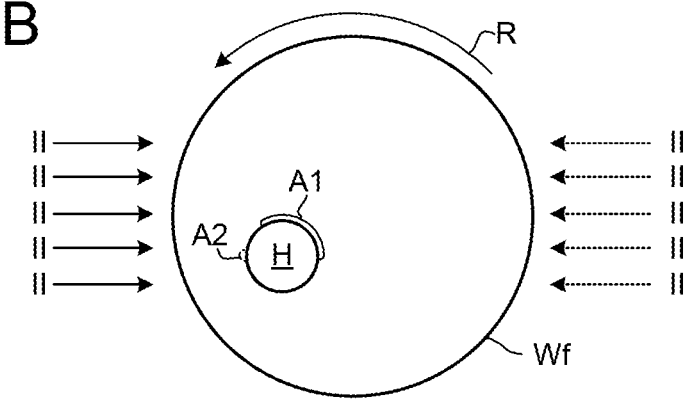
Figure 23C:
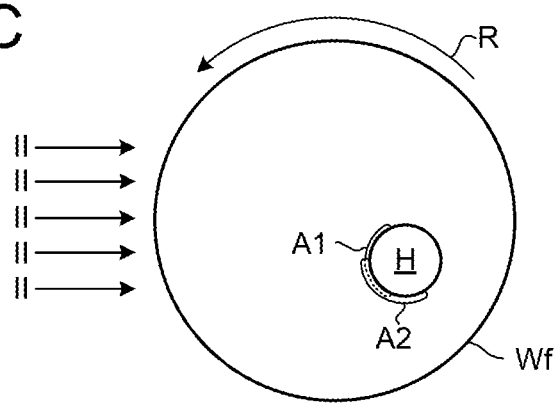
Figure 24A:
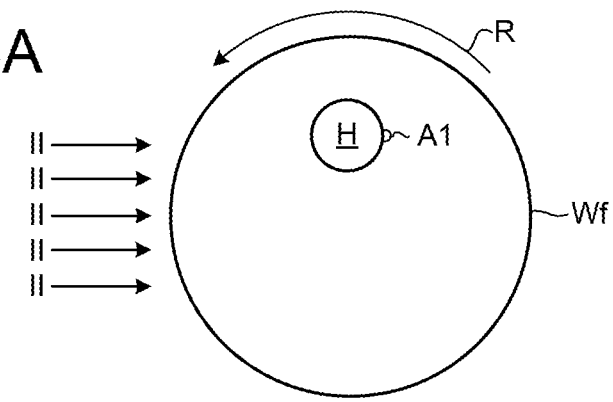
FIG. 24A to FIG. 24D are schematic diagrams each illustrating a state of performing processing while rotating the wafer.
Figure 24B:
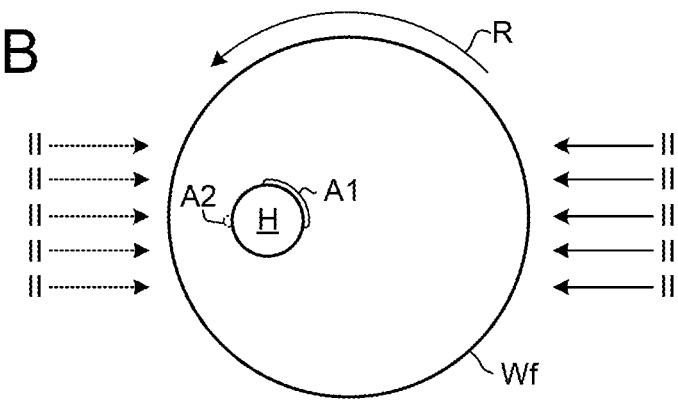
Figure 24C:
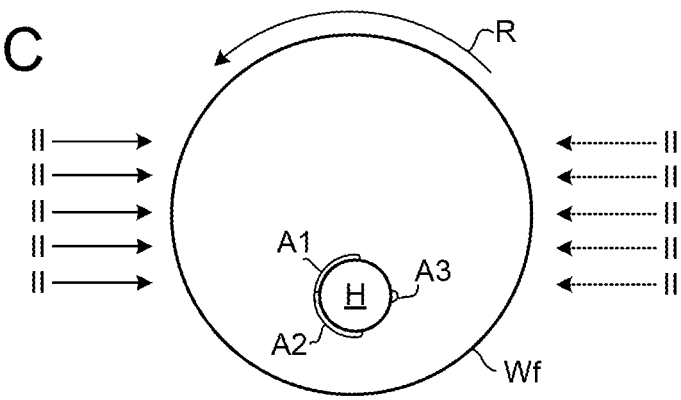
Figure 24D:
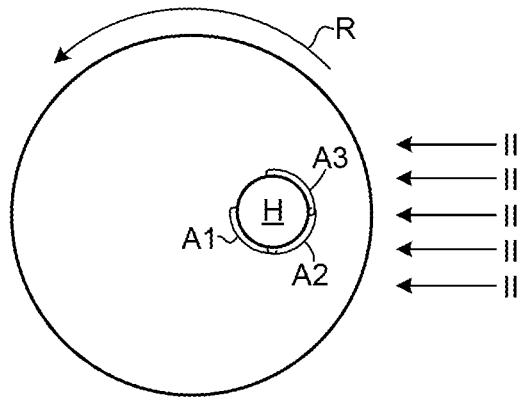

Note that although it is assumed that the switching is instantaneously conducted in FIG. 22A to FIG. 22D, in reality, the transition time ΔT is required as described above, and depending on the setting of the transition time ΔT, the process uniformity in the circumferential direction changes. For example, if the transition time ΔT is set to one corresponding to the integer number of times of rotation, the uniformity in the circumferential direction becomes one same as that in the case where the transition time ΔT is not provided. When the transition time ΔT is shorter than the switching periods T1 and T2, a switching position is deviated by the transition time ΔT (not illustrated).

b) Case where the switching period T is ⅓ times the rotation period Tr (refer to FIG. 23A to FIG. 23C)

The case where each of the switching periods T1 and T2 is ⅓ times the rotation period Tr is considered.

FIG. 23A to FIG. 23C illustrate states where the wafer Wf makes 0 rotation, ⅓ rotations, and ⅔ rotations, respectively. The state where the wafer Wf makes ⅔ rotations in FIG. 23C shifts to a state where the wafer Wf makes one rotation corresponding to FIG. 23A. FIG. 23A to FIG. 23B, and FIG. 23B to FIG. 23C correspond to the switching periods T1 and T2, respectively. Specifically, at a moment illustrated in FIG. 23A to FIG. 23C, the direction of ions II is switched from the left to the right, or from the right to the left.

In the switching periods T1 and T2, the areas A1 and A2 are etched, respectively.

As illustrated in FIG. 23A to FIG. 23C, parts of etching positions A1 and A2 on the circumference are overlapped. However, the overlapped parts are deviated each time the rotation and the switching are repeated. When several tens to several hundreds of times of rotations are conducted, the process uniformity in the circumferential direction is maintained in consequence.

Note that when the transition time ΔT is taken into consideration, the uniformity in the circumferential direction is influenced by the length of the transition time ΔT, resulting in that an additional adjustment becomes required.

c) Case where the switching period T is ¼ times the rotation period Tr (refer to FIG. 24A to FIG. 24D)

The case where the switching period T is ¼ times the rotation period Tr is considered.

FIG. 24A to FIG. 24D illustrate states where the wafer Wf makes 0 rotation, ¼ rotations, 2/4 rotation, and ¾ rotations, respectively. The state where the wafer Wf makes ¾ rotations in FIG. 24D shifts to a state where the wafer Wf makes one rotation corresponding to FIG. 24A. FIG. 24A to FIG. 24B, FIG. 24B to FIG. 24C, and FIG. 24C to FIG. 24D correspond to the switching periods T1, T2, and T1, respectively. Specifically, at a moment illustrated in FIG. 24A to FIG. 24D, the direction of ions II is switched from the left to the right, or from the right to the left.

In the switching periods T1, T2, and T1, the areas A1, A2, and A3 are etched, respectively.

In this case, the whole surface of the wafer Wf is shaved when the wafer Wf makes one rotation, so that the uniformity in the etching direction can be secured.

When the transition time ΔT is taken into consideration, the uniformity in the circumferential direction is influenced by the length of the transition time ΔT.

As described above, the concrete examples regarding the switching periods T1 and T2, and the rotation period Tr are described as in the cases a to c, but, cases other than the above can also be considered. As described in the concrete examples, when the incident direction of ions II is switched in the middle of the rotation, there is an unfavorable relation among the switching period T, the rotation period Tr, and the transition time ΔT. Practically, it is preferable that each of the switching periods T1 and T2, and the transition time ΔT is an integral multiple of the rotation period Tr.

The rotation period Tr is assumed to be fallen within a range of about 0.01 seconds to 100 seconds. The transition time ΔT is assumed to be about several times to several tens of times the rotation period Tr. It is preferable that the transition time ΔT is as small as possible with respect to the switching periods T1 and T2 so that a long period of time in which the oblique incidence is effective can be secured. This is because the vertical incidence or the etching is not conducted during the transition time ΔT.

Note that the applied voltage is a sine wave, so that strictly speaking, the voltage changes during one period of high frequency or low frequency, and in accordance with the change, the oblique component also varies. However, the variation and a time scale of the rotation are different by at least $10^5$ or more, so that an influence of the variation of the oblique component in the period of low frequency can be ignored.

MODIFIED EXAMPLES 4 TO 6

Hereinafter, modified examples of the third embodiment (modified examples 4 to 6) will be described. The modified examples 4 to 6 are for specifically explaining a mechanism that relatively rotates between the wafer Wf and the substrate electrode 15. Accordingly, each of the modified examples is illustrated by a partial configuration diagram which omits a part other than a part of the rotating mechanism.

(1) MODIFIED EXAMPLE 4

Figure 25:
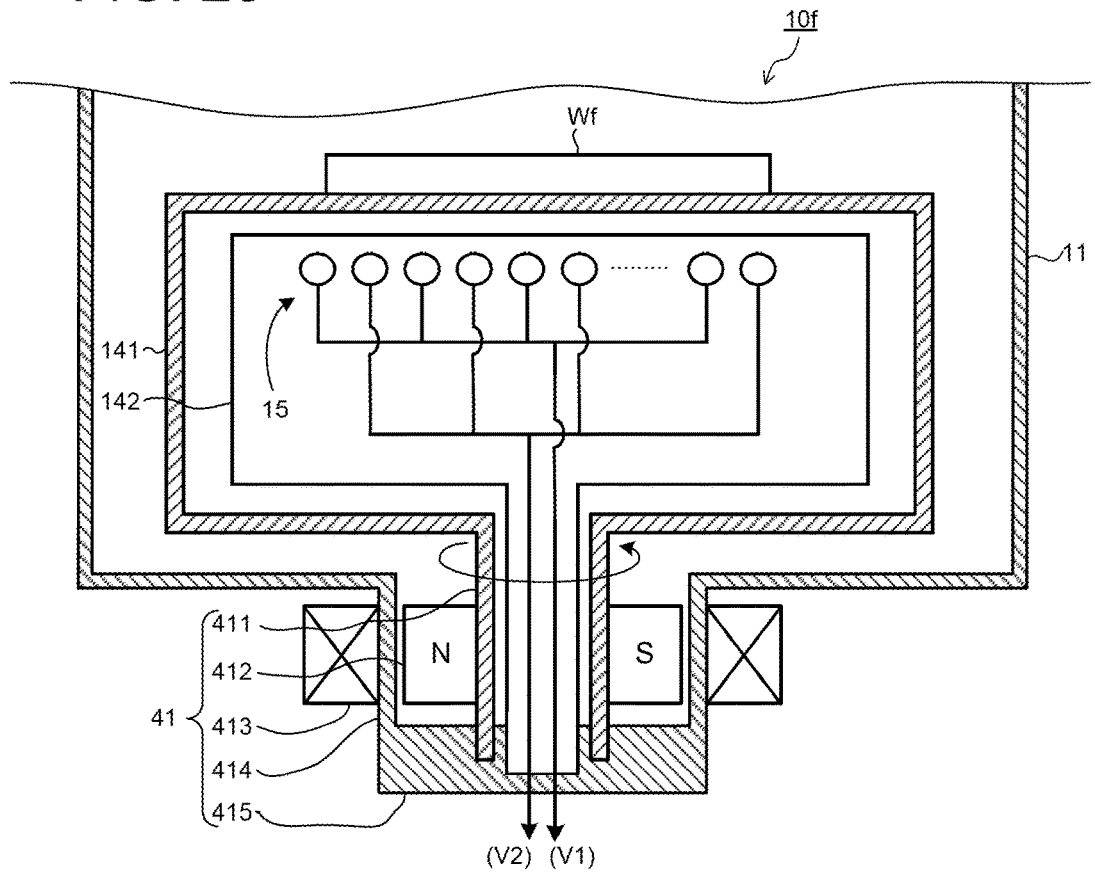
FIG. 25 is a partial configuration diagram of a plasma processing apparatus 10f according to a modified example 4.

FIG. 25 is a partial configuration diagram of a plasma processing apparatus 10f according to the modified example 4. The plasma processing apparatus 10f has a susceptor 141, a substrate electrode block 142, and a motor 41, in place of the susceptor 14, and the wafer rotating mechanism 18 in the plasma processing apparatus 10e.

The motor 41 is provided for rotating the susceptor 141, and has a rotating shaft 411, a rotor 412, a stator 413, a side plate 414, and a bottom plate 415.

The rotating shaft 411, the rotor 412, and the stator 413 form a rotating mechanism. The rotating shaft 411 is connected to the susceptor 141. The rotating shaft 411 is formed in a cylindrical shape, and in the inside thereof, a shaft of the substrate electrode block 142 is disposed. The rotor 412 is a magnet disposed on a side surface of the rotating shaft 411. The stator 413 is an electromagnet disposed on the outside of the side plate 414 so as to approximate to the rotor 412 with the side plate 414 therebetween. By a magnetic force generated by periodically changing the north pole and the south pole of the magnetic field of the stator 413, the rotor 412 rotates with respect to the stator 413. As a result of this, the rotating shaft 411 and the rotor 412 in the chamber 11 (vacuum side), and the stator 413 on the outside of the chamber 11 (atmosphere side) are separated from each other.

Note that in this case, the rotor 412 uses the permanent magnet and the stator 413 uses the electromagnet, but, it is also possible that the rotor 412 uses the electromagnet and the stator 413 uses the permanent magnet, or both of the rotor 412 and the stator 413 use the electromagnet. The same applies to the following modified examples 5 and 6.

The susceptor 141 is connected to the rotating shaft 411 in a state of holding the wafer Wf on its upper surface, and is rotated by the rotating mechanism. As a result of this, the wafer Wf is rotated by the rotating mechanism.

The susceptor 141 has an internal space for holding the substrate electrode block 142.

The substrate electrode block 142 is disposed in the inside of the susceptor 141, and is not rotated by being fixed to the bottom plate 415.

The voltage waveforms V1 and V2 (the voltage waveforms in each of which the RF high-frequency voltage Va and the RF low-frequency voltage Vb are superposed) are supplied to the substrate electrode 15 in the chamber 11 from the RF high-frequency power source 21a and the RF low-frequency power source 21b disposed on the outside of the chamber 11.

By rotating the wafer Wf, oblique ions are incident on the wafer Wf from all directions.

(2) MODIFIED EXAMPLE 5

Figure 26:
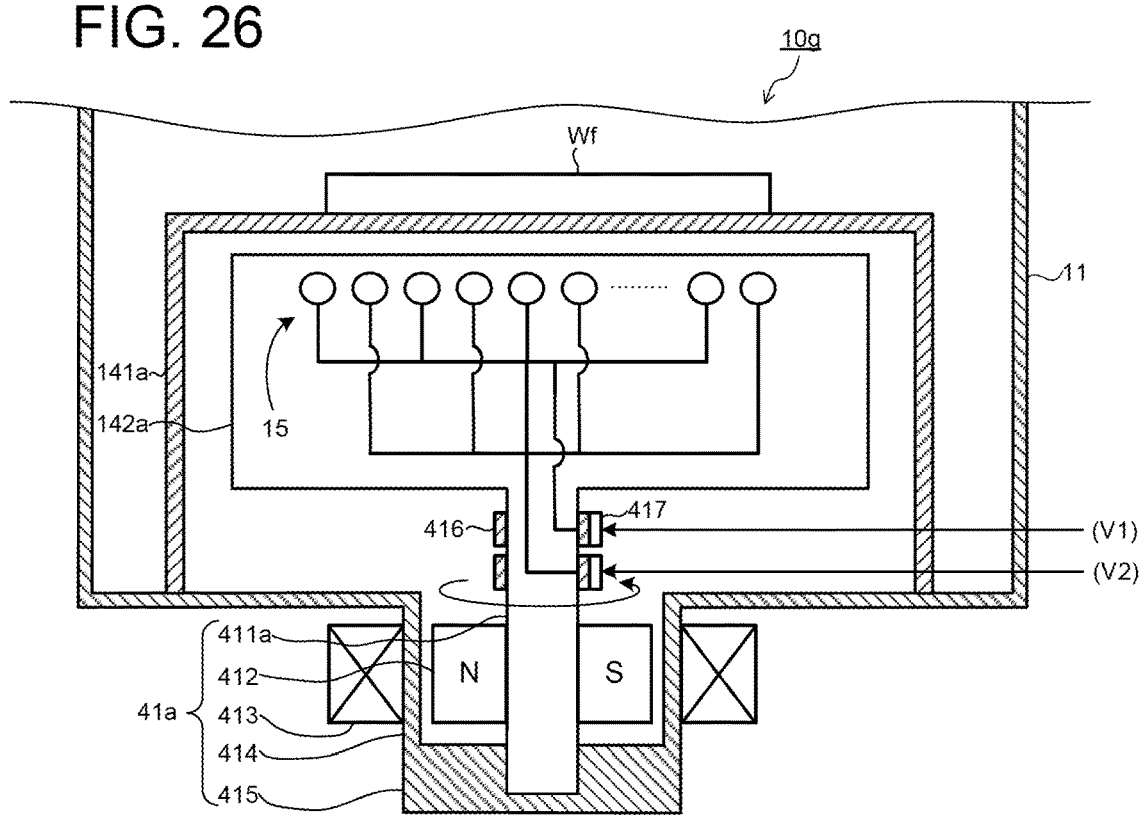
FIG. 26 is a partial configuration diagram of a plasma processing apparatus 10g according to a modified example 5.

FIG. 26 is a partial configuration diagram of a plasma processing apparatus 10g according to the modified example 5. The plasma processing apparatus 10g has a susceptor 141a, a substrate electrode block 142a, and a motor 41a, in place of the susceptor 14b and the wafer rotating mechanism 18 in the plasma processing apparatus 10e.

The motor 41a is provided for rotating the substrate electrode block 142a, and has a rotating shaft 411a, the rotor 412, the stator 413, the side plate 414, the bottom plate 415, ring electrodes 416, and brush electrodes 417.

The rotating shaft 411a, the rotor 412, and the stator 413 form a rotating mechanism. The rotating shaft 411a is connected to the substrate electrode block 142a. The rotor 412 is a magnet disposed on a side surface of the rotating shaft 411a. The stator 413 is an electromagnet disposed on the outside of the side plate 414 so as to approximate to the rotor 412 with the side plate 414 therebetween. By a magnetic force generated by periodically changing the north pole and the south pole of the magnetic field of the stator 413, the rotor 412 rotates with respect to the stator 413. As a result of this, the rotating shaft 411a and the rotor 412 in the chamber 11 (vacuum side), and the stator 413 on the outside of the chamber 11 (atmosphere side) are separated from each other.

The ring electrode 416 and the brush electrode 417 are provided for securing an electrical connection with respect to the substrate electrode 15 during the rotation of the rotating shaft 411a, by being brought into contact with each other in a state where they are slid relative to each other. The ring electrode 416 is a ring-shaped electrode disposed by being fixed to an outer periphery of the rotating shaft 411a. The brush electrode 417 is a brush-shaped electrode which is brought into contact with the ring electrode 416 by sliding relative to the ring electrode 416, during the rotation of the rotating shaft 411a.

The voltage waveforms V1 and V2 from the switching mechanism 24 are supplied to the substrate electrode 15 in the chamber 11 from the RF high-frequency power source 21a and the RF low-frequency power source 21b disposed on the outside of the chamber 11 via the brush electrodes 417 and the ring electrodes 416.

The susceptor 141a has an internal space for holding the substrate electrode block 142a. The susceptor 141a is not rotated by being fixed to the chamber 11.

The substrate electrode block 142a is disposed in the inside of the susceptor 141a. The substrate electrode block 142a is connected to the rotating shaft 411a, and is rotated by the rotating mechanism. As a result of this, the substrate electrode 15 is rotated by the rotating mechanism.

By rotating the substrate electrode 15, an electric field distribution generated on the wafer Wf is rotated, resulting in that oblique ions are incident on the wafer Wf from all directions.

Note that the plasma processing apparatus 10g may also have an electrostatic chuck. A DC voltage is connected to a rotating part via a brush current introduction electrode, and is supplied to a DC electrode.

(3) MODIFIED EXAMPLE 6

Figure 27:
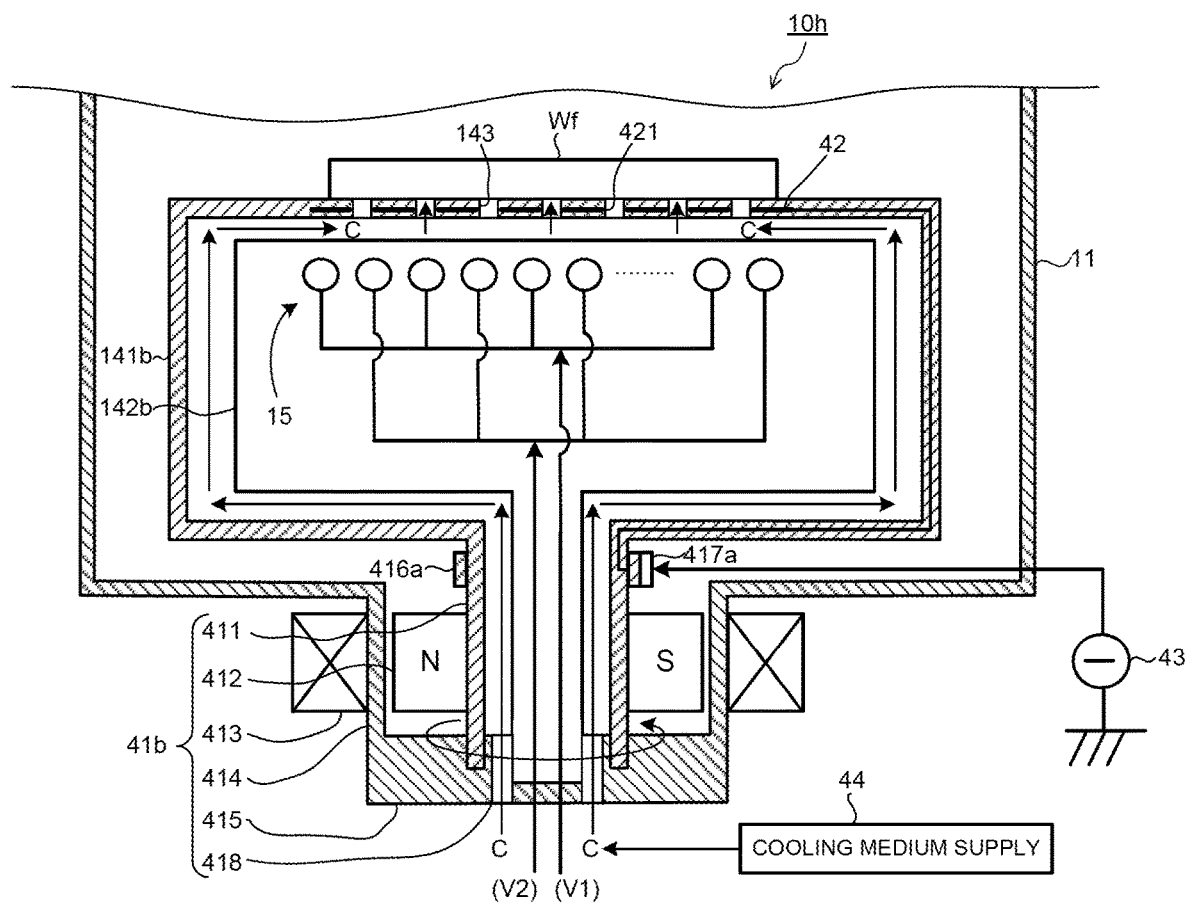
FIG. 27 is a partial configuration diagram of a plasma processing apparatus 10h according to a modified example 6.

FIG. 27 is a partial configuration diagram of a plasma processing apparatus 10h according to the modified example 6. The plasma processing apparatus 10h has a susceptor 141b, a substrate electrode block 142b, a motor 41b, an electrostatic chuck 42, a DC power source 43, and a cooling medium supply unit 44, in place of the susceptor 14 and the wafer rotating mechanism 18 in the plasma processing apparatus 10e.

The motor 41b is provided for rotating the substrate electrode block 142b, and has the rotating shaft 411, the rotor 412, the stator 413, the side plate 414, the bottom plate 415, a ring electrode 416a, a brush electrode 417a, and an opening 418.

The rotating shaft 411, the rotor 412, and the stator 413 form a rotating mechanism. The configuration, the operation and the like of the rotating mechanism are substantially similar to those of the modified example 4, so that detailed explanation thereof will be omitted.

The ring electrode 416a and the brush electrode 417a are provided for securing an electrical connection with respect to an internal electrode of the electrostatic chuck 42 during the rotation of the rotating shaft 411, by being brought into contact with each other in a state where they are slid relative to each other. The ring electrode 416a is a ring-shaped electrode disposed by being fixed to an outer periphery of the rotating shaft 411. The brush electrode 417a is a brush-shaped electrode which is brought into contact with the ring electrode 416a by sliding relative to the ring electrode 416a, during the rotation of the rotating shaft 411.

The electrostatic chuck 42 is provided for electrostatically attracting the wafer Wf, and has a plurality of openings 421. The internal electrode of the electrostatic chuck 42 is a kind of mesh-shaped electrode, and functions as an attraction electrode having a plurality of openings.

Figure 28:
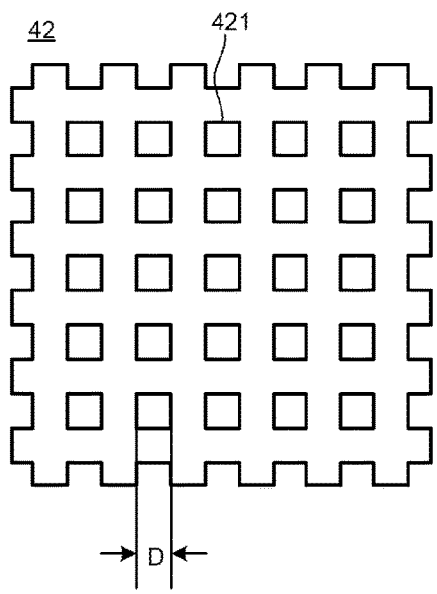
FIG. 28 and FIG. 29 are plan views each illustrating one example of an internal electrode of an electrostatic chuck 42.
Figure 29:
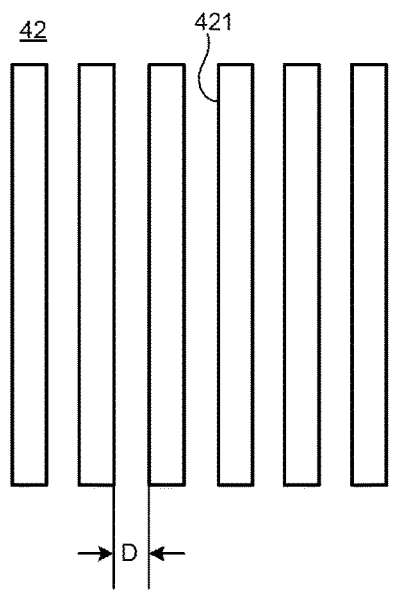

FIG. 28 and FIG. 29 are plan views each illustrating one example of the internal electrode of the electrostatic chuck 42. In FIG. 28, square-shaped openings (air gaps) 421 are arranged in lines in the vertical and horizontal two directions (a kind of mesh-shaped electrode). In FIG. 29, rectangular (line-shaped) openings (air gaps) 421 are arranged in lines (a kind of line-shaped electrode). In FIG. 28 and FIG. 29, the rectangular openings are arranged in two directions and in one direction, respectively.

When the electrostatic chuck 42 is used for making the susceptor hold the substrate, in the plasma processing apparatus 10x, a low-frequency voltage for introducing ions and a DC voltage for electrostatic attraction are superposed to be applied to the substrate electrode 15x. Specifically, the substrate electrode 15x and the internal electrode of the electrostatic chuck are integrated.

When a DC voltage is superposed to be applied by using one DC power source which is not illustrated, in the first to third embodiments, it is required to provide a filter mechanism with the use of a capacitance and an inductance, for example, in order to prevent the low-frequency voltage from the low-frequency power source for each of the electrode groups from flowing into the different electrode groups via the DC power source to be connected (similar to the HPF (high pass filter) in the case of superposing the high-frequency voltage).

Further, when there is provided the mechanism of relatively rotating between the wafer Wf and the substrate electrode 15 as described in the modified examples 4 and 5, it becomes difficult to attract the wafer Wf by using the same electrode since the wafer Wf and the substrate electrode 15 are separated. In this case, it becomes necessary to additionally provide the electrode for electrostatic attraction in the vicinity of the wafer Wf, as described in the modified example 6.

The line-shaped openings 421 illustrated in FIG. 29 are suitable for a case where the susceptor 14, the substrate electrode 15 and the like are not rotated as described in the first and second embodiments. In this case, an axis of the opening 421 is preferably made to coincide with the axis Ay of the opening 331 of the trench Tr and the axis of the electrode element E (refer to FIG. 2, FIG. 3 and FIG. 19).

In this case, the shape of the opening 421 is set to a rectangular shape, but, it is also possible to employ a circular opening, an elliptical opening and the like, in place of the rectangular opening.

As illustrated in FIG. 28 and FIG. 29, the opening 421 has a width D (which corresponds to the electrode interval D in FIG. 2). As will be described later, the width D is preferably 2 to 5 mm.

The DC power source 43 supplies a DC voltage to the internal electrode of the electrostatic chuck 42, thereby making the electrostatic chuck 42 electrostatically attract the wafer Wf. The DC voltage from the DC power source 43 is supplied to the internal electrode of the electrostatic chuck 42 in the susceptor 141b via the brush electrode 417a and the ring electrode 416a.

The cooling medium supply unit 44 supplies a cooling medium C for cooling the wafer Wf. From the point of view of inertness, thermal conductivity and the like, it is preferable to use He, for example, as the cooling medium C.

The susceptor 141b has openings 143 for introducing the cooling medium C. The bottom plate 415 has the opening 418 for introducing the cooling medium C into the susceptor 141b. The cooling medium C supplied from the cooling medium supply unit 44 passes through the opening 418 and the inside of the susceptor 141b to be supplied to a rear surface of the wafer Wf through the openings 143, thereby cooling the wafer Wf.

The cooling medium C after cooling the wafer Wf is released in the chamber 11, and is exhausted to the outside from the exhaust port 12.

Fourth Embodiment

Figure 30:
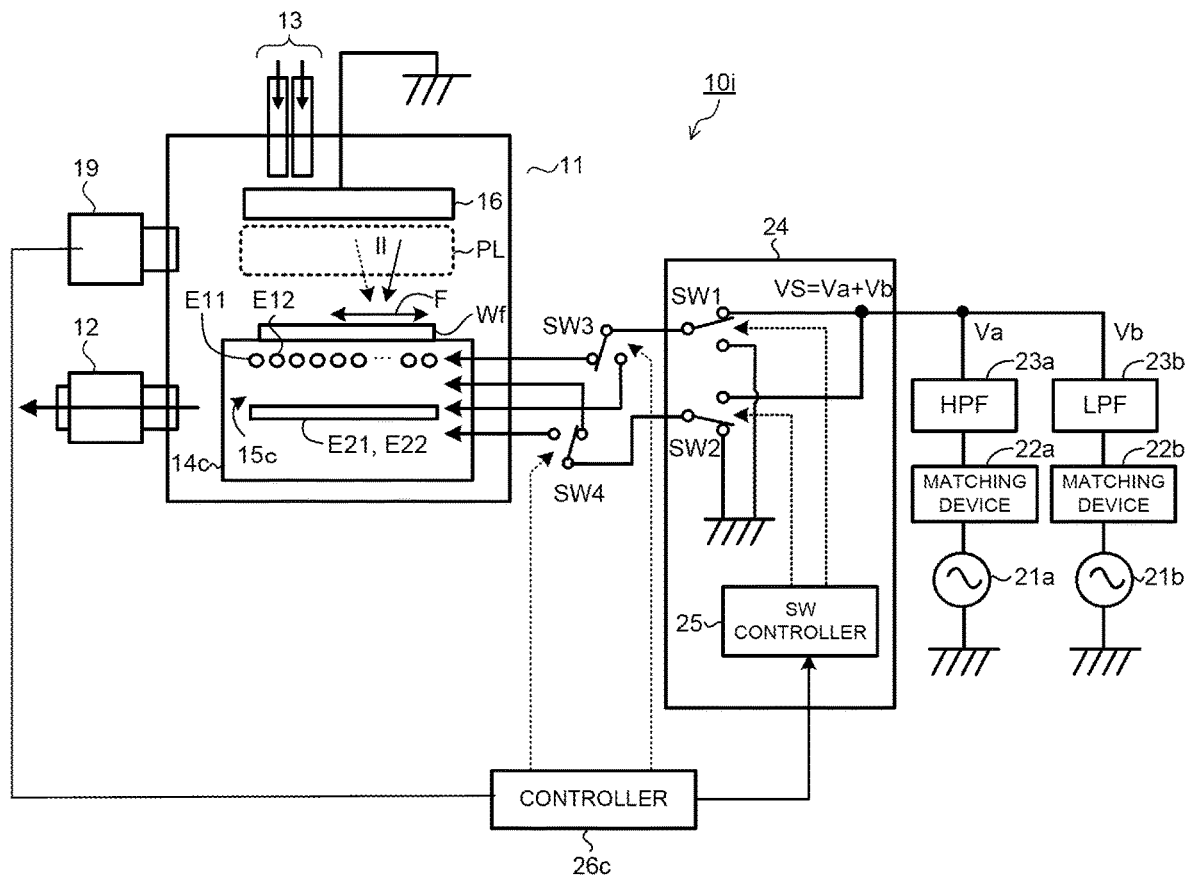
FIG. 30 is a schematic configuration diagram of a plasma processing apparatus 10i according to a fourth embodiment.

FIG. 30 is a schematic configuration diagram of a plasma processing apparatus 10i according to a fourth embodiment. The plasma processing apparatus 10i has the chamber 11, the exhaust port 12, the process gas introduction pipe 13, a susceptor 14c, a substrate electrode 15c, the counter electrode 16, the termination detector 19, the RF high-frequency power source 21a, the RF low-frequency power source 21b, the matching devices 22a and 22b, the filters 23a and 23b, the switching mechanism 24, a controller 26c, and switches SW3 and SW4. Note that the illustration of capacitors is omitted for easier view.

When compared to the plasma processing apparatus 10e, the plasma processing apparatus 10i does not have the wafer rotating mechanism 18, and uses the substrate electrode 15c, in place of the substrate electrode 15.

Figure 31:
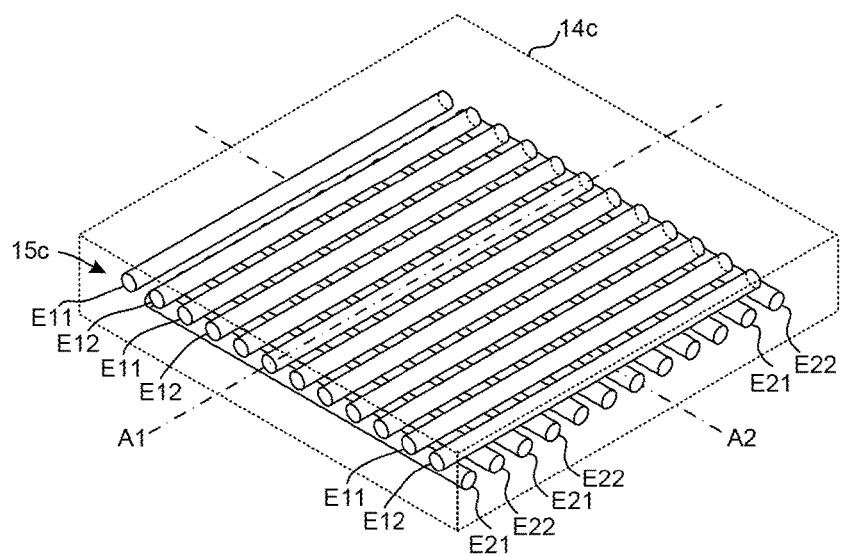
FIG. 31 is a perspective view illustrating one example of a configuration of a substrate electrode 15c.

FIG. 31 is a perspective view illustrating one example of a configuration of the substrate electrode 15c. The substrate electrode 15c is formed of electrode elements E11 and E12, and electrode elements E21 and E22, which are arranged in the up and down directions. Here, it can be considered that the electrode elements E11 and E12 form a first electrode element group, and the electrode elements E21 and E22 form a second electrode element group. Specifically, the substrate electrode 15c has these first and second electrode element groups.

The electrode elements E11 and E12 correspond to the electrode elements E1 and E2 in the first embodiment, and are alternately arranged along an axial direction A1.

The electrode elements E21 and E22 are alternately arranged along an axial direction A2 under the electrode elements E11 and E12. These axial directions A1 and A2 are mutually different (the directions are orthogonal to each other, for example).

By switching, with the use of the switching mechanism 24 and the controller 26c, either on or off in the respective electrode elements E11 and E12, and electrode elements E21 and E22, oblique components are respectively obtained. Further, by applying the voltage to both of the E11 and E12 or both of the E21 and the E22, the vertical incidence can be realized.

As described above, the switches SW3 and SW4 switch the electrode elements E11 and E12, and the electrode elements E21 and E22, to apply the superposed voltage VS in which the RF high-frequency voltage Va and the RF low-frequency voltage Vb are superposed.

Since the axial direction A1 of the electrode elements E21 and E22 is different from the axial direction A2 of the electrode elements E11 and E12, it is possible to simultaneously or independently realize the oblique components in the two directions, resulting in that it is possible to deal with processing of a shape having trenches in multiple directions.

Fifth Embodiment

Figure 32:
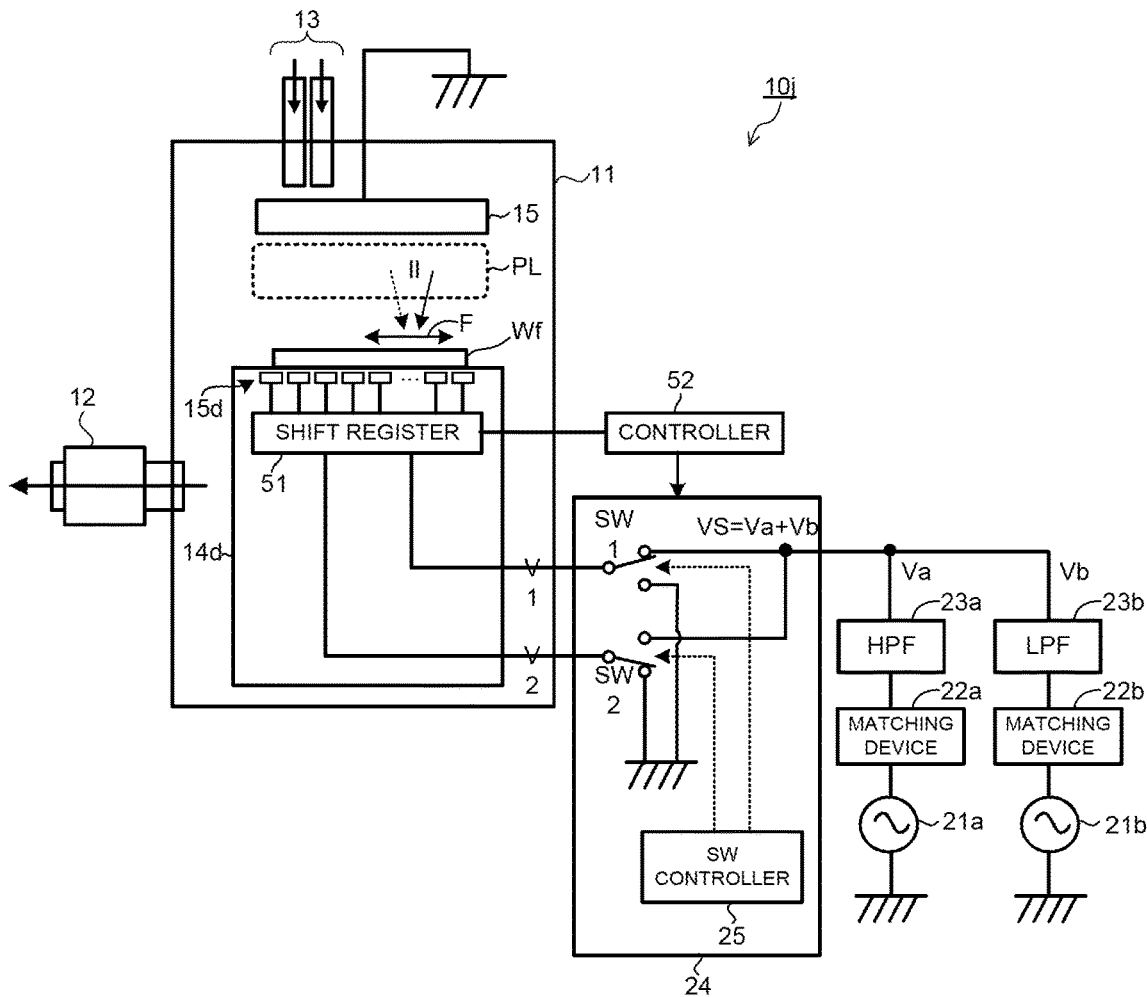
FIG. 32 is a schematic configuration diagram of a plasma processing apparatus 10j according to a fifth embodiment.

FIG. 32 is a schematic configuration diagram of a plasma processing apparatus 10j according to a fifth embodiment.

The plasma processing apparatus 10j has the chamber 11, the exhaust port 12, the process gas introduction pipe 13, a susceptor 14d, a substrate electrode 15d, the counter electrode 16, a shift register 51, a controller 52, the RF high-frequency power source 21a, the RF low-frequency power source 21b, the matching devices 22a and 22b, the filters 23a and 23b, and the switching mechanism 24.

Figure 33:
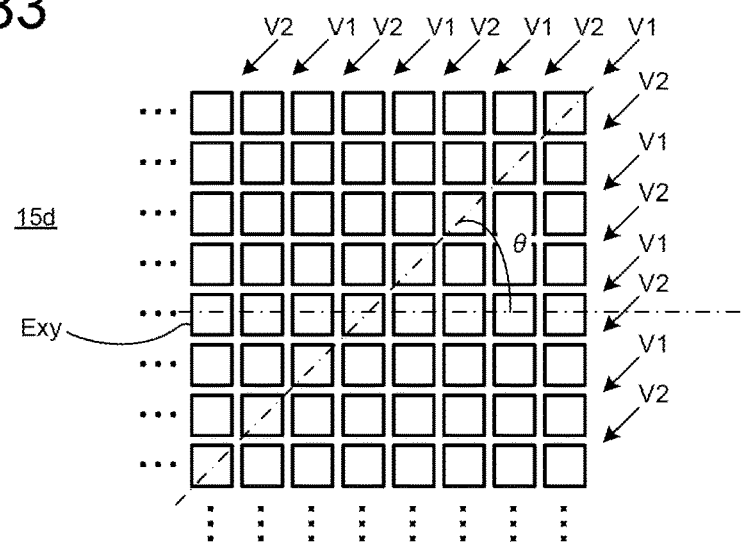
FIG. 33 is a plan view illustrating a state where the substrate electrode 15d is seen from the above.
Figure 34A:
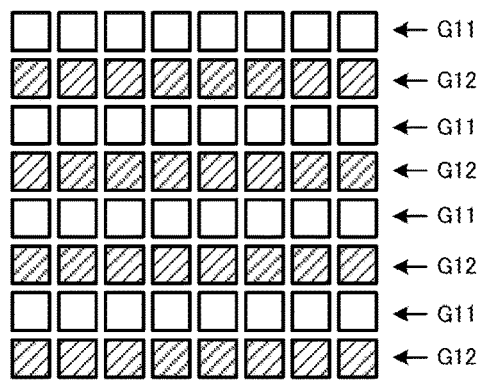
FIG. 34A to FIG. 34D are schematic diagrams each illustrating a state where electrode elements Exy are classified into (selected as) groups.
Figure 34B:
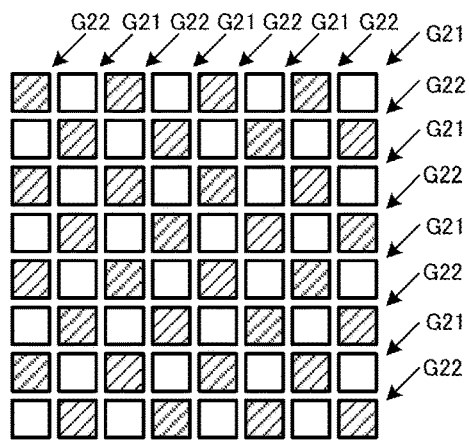
Figure 34C:
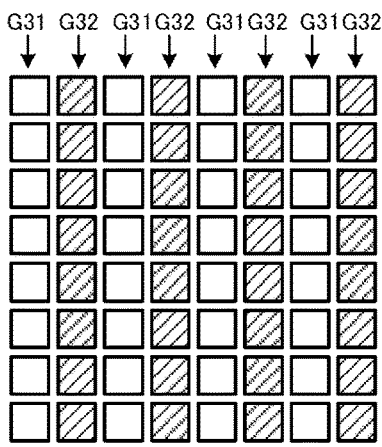
Figure 34D:
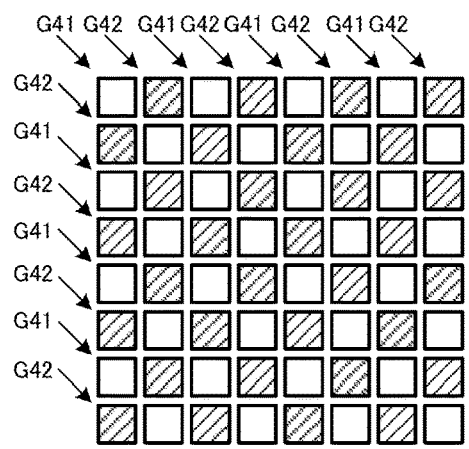

FIG. 33 is a plan view illustrating a state where the substrate electrode 15d is seen from the above. The substrate electrode 15d has electrode elements Exy which are arranged in lines in the vertical and horizontal two directions. Here, although the electrode elements Exy are arranged in the vertical and horizontal two directions, which are orthogonal to each other, the directions are not necessarily required to be orthogonal to each other. It is sufficient if the electrode elements Exy are arranged in lines in mutually different first and second directions.

Here, the electrode element Exy has a rectangular shape (square shape) when seen from the above, but, it may also be formed to have a circular shape.

The shift register 51 performs a selection to connect the electrode elements Exy to either the switch SW1 or the switch SW2. The shift register 51 functions as a selecting unit that selects, from a plurality of electrode elements, the plurality of electrode element groups arranged along one direction. The shift register 51 selects the electrode elements Exy so that the electrode elements Exy are classified into two on/off groups (line-shaped groups) which are parallel to each other (arranged in approximately the same direction θ), for example.

FIG. 34A to FIG. 34D illustrate cases where the electrode elements Exy are classified into (selected as) groups G11 and G12, groups G21 and G22, groups G31 and G32, and groups G41 and G42, in which the direction θ corresponds to 0°, 45°, 90°, and 135°, respectively.

In this case, the shift register 51 selects any of first and second electrode element groups (the groups G11 and G12, the groups G21 and G22, the groups G31 and G32, and the groups G41 and G42) which are arranged along a first direction (0° direction), a second direction (90° direction), a third direction being an intermediate direction between the first and second directions (45° direction), and a fourth direction being an intermediate direction between the second and first directions (135° direction), respectively.

Here, although the third direction is set to the direction which is right between the first and second directions, it is also possible to set an arbitrary intermediate direction between the first and second directions. Further, it is also possible to set an arbitrary intermediate direction between the second and first directions, as the fourth direction. Further, it is also possible to set a plurality of intermediate directions between the first and second directions.

The controller 52 controls the shift register 51 to change the grouping of the electrode elements Exy so that the direction θ sequentially rotates. For example, it is set that the groups G11 and G12, the groups G21 and G22, the groups G31 and G32, and the groups G41 and G42 in FIG. 34A to FIG. 34D are periodically and repeatedly selected. This means that the direction θ in which the electrode elements Exy are grouped rotates. The groups G11 and G12 correspond to both cases where θ equals to 0° and where θ equals to 180°, so that when the groups G11 and G12 are selected after the selection of the groups G41 and G42, this means that the electric field from the substrate electrode 15d is rotated.

By rotating the line-shaped groups, the electric field distribution generated on the wafer Wf is rotated, resulting in that oblique ions are incident on the wafer Wf from all directions. Specifically, it becomes possible to achieve an effect similar to that achieved when the wafer Wf is rotated.

As described above, the controller 52 controls the switching mechanism 24, to thereby change the connection relation of the electrode elements Exy and the switches SW1 and SW2 in time series. Specifically, the controller 52 makes the arranging direction θ of the selected electrode elements Exy to be temporally changed.

Sixth Embodiment

Figure 35:
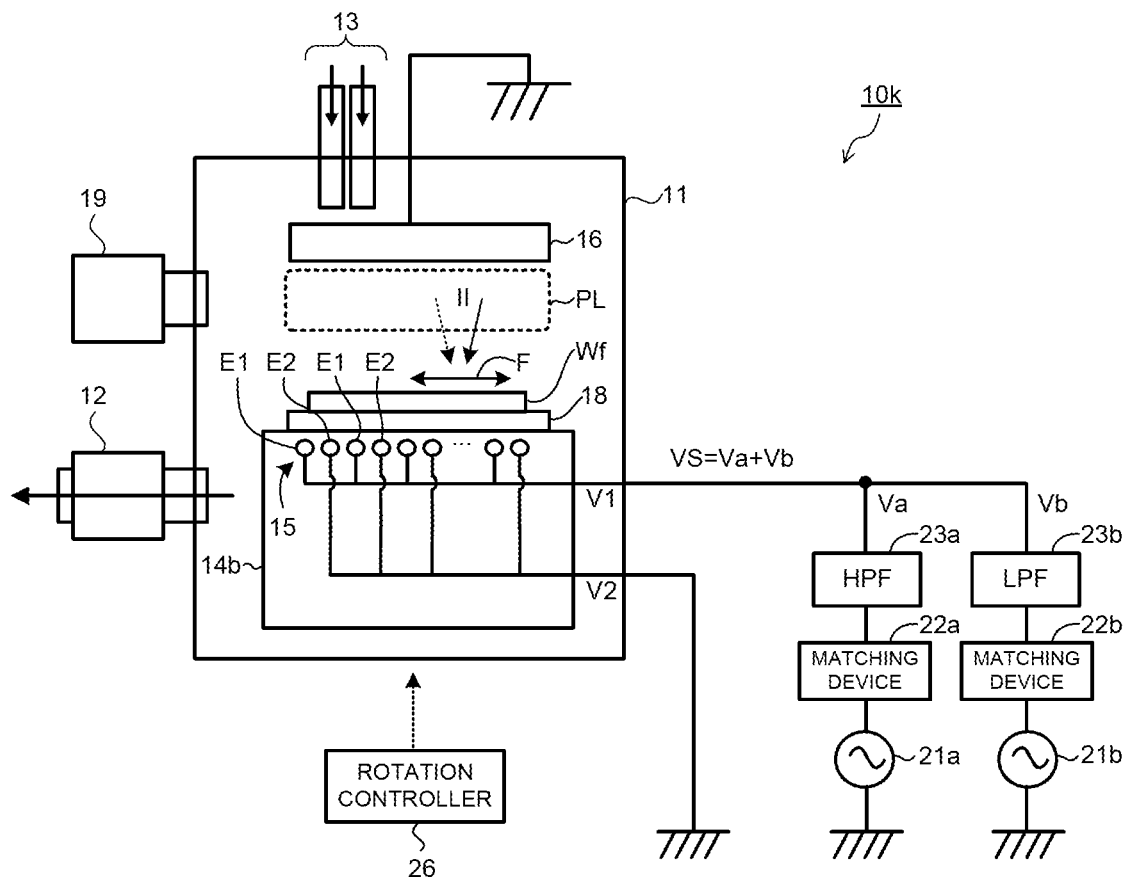
FIG. 35 is a partial configuration diagram of a plasma processing apparatus 10k according to a sixth embodiment.

FIG. 35 is a schematic configuration diagram of a plasma processing apparatus 10k according to a sixth embodiment. The plasma processing apparatus 10k has the chamber 11, the exhaust port 12, the process gas introduction pipe 13, the susceptor 14b, the substrate electrode 15, the counter electrode 16, the wafer rotating mechanism 18, the termination detector 19, the RF high-frequency power source 21a, the RF low-frequency power source 21b, the matching devices 22a and 22b, the filters 23a and 23b, and the rotation controller 26.

In this case, the superposed voltage VS in which the voltages Va and Vb are superposed is applied to one side of the substrate electrode 15 (electrode element E1 or E2), and the other side of the electrode groups is grounded. Accordingly, the oblique incident process only in the one-side direction is performed. Note that it is also possible to constantly apply the high-frequency voltage Va to both of the electrode groups, as in the second embodiment.

As already illustrated in FIG. 21, when the rotating mechanism is introduced, the switching mechanism of the applied voltage is not necessarily required. By constantly performing only the one-side oblique incidence as in the present embodiment, the process uniformity in the circumferential direction is achieved without depending on the rotation period.

Seventh Embodiment

Figure 36:
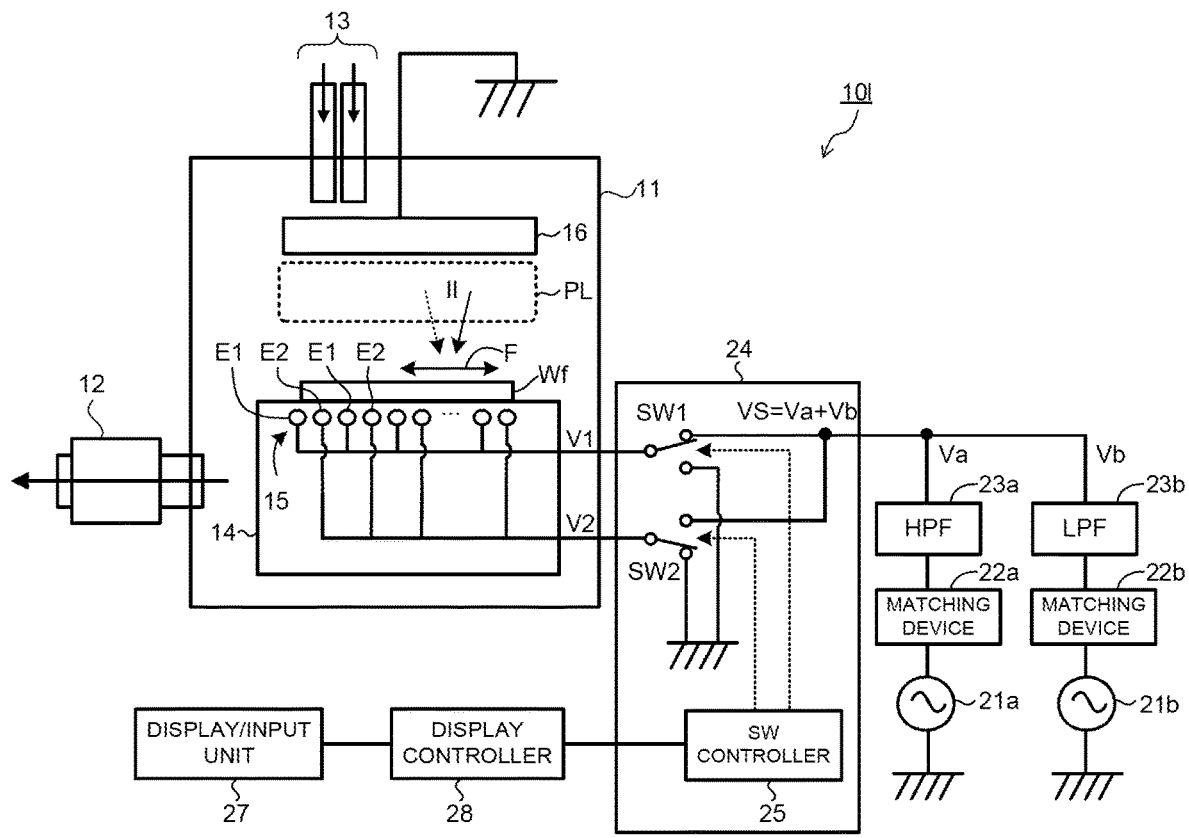
FIG. 36 is a schematic configuration diagram of a plasma processing apparatus 10l according to a seventh embodiment.

FIG. 36 is a diagram illustrating a plasma processing apparatus 101 according to a seventh embodiment. The plasma processing apparatus 101 has a display/input unit 27, and a display controller 28.

The display/input unit 27 is a touch display, for example, a liquid crystal display device which enables both of a display and an input of information. The display/input unit 27 can perform display by distinguishing between the vertical incidence and the oblique incidence of ions.

The display controller 28 controls the display and the input in the display/input unit 27.

A process condition is input into the plasma processing apparatus 101 by using the display/input unit 27, and the process is started.

Figure 37A:
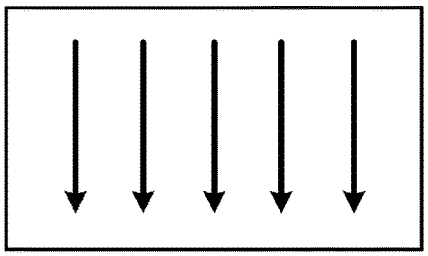
FIG. 37A and FIG. 37B are diagrams each illustrating one example of a screen display.
Figure 37B:
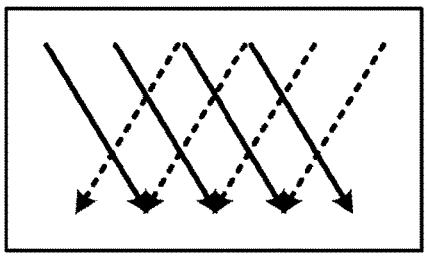

FIG. 37A and FIG. 37B illustrate the vertical incidence and the oblique incidence, respectively, of ions displayed on the display/input unit 27. If the configuration as above is employed, it is possible to display, in an easily understandable manner, whether the processing in the plasma processing apparatus 10 corresponds to either the vertical incidence or the oblique incidence, which is convenient for a user of the plasma processing apparatus 10.

Further, it is also possible to display, on the display/input unit 27, a timing of the vertical incidence and the oblique incidence of ions. For example, when switching the vertical incidence and the oblique incidence, a red mark and a green mark are alternately blinked on the display/input unit 27.

Further, it is also possible to display, at a time of setting the process condition, the incident direction of ions by an arrow mark on the display/input unit 27. At this time, it becomes convenient for a user if an angle of the arrow mark is changed by being corresponded to the incident direction of ions.

Further, it is also possible to design such that the arrow mark is displayed as an icon, and when the icon is touched, the incident angle is displayed by a numeric value. Further, it is also possible to design such that the displayed numeric value is set as an icon, and when the numeric value is touched, the numeric value can be changed.

EXAMPLES

Hereinafter, examples will be described.

FIG. 38A to FIG. 38C, and FIG. 39A to FIG. 39C are graphs each illustrating a result of plasma simulation of angle distributions of ions II which are incident on the wafer Wf in the plasma processing apparatus 10. The above-described simulation is conducted regarding a half area from a center of the plasma processing apparatus 10 by using commercially available software (VizGlow). Incident amounts of ions II over one period of the RF low-frequency voltage are integrated to calculate the angle distribution of the ions incident on the substrate.

Figure 40:
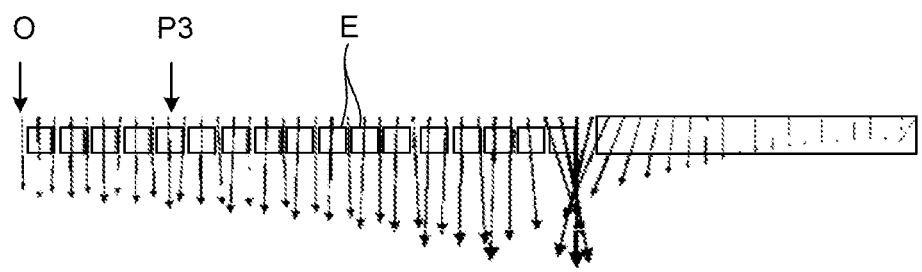
FIG. 40 is a diagram illustrating an electric field distribution of an entire calculation area.

FIG. 40 illustrates an electric field distribution of an entire calculation area. Electric fields with respect to the arranged electrode elements E are indicated by arrow marks. Further, a center O of the wafer Wf, and a later-described evaluation point P3 are illustrated.

Figure 41:
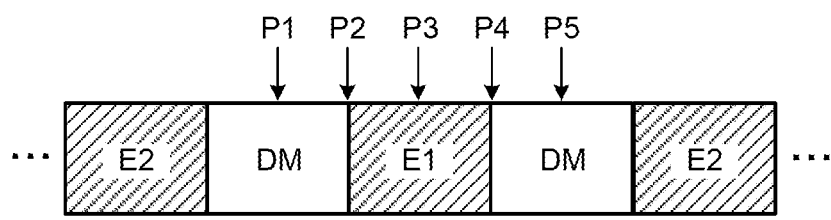
FIG. 41 is a diagram illustrating evaluation points P1 to P5 with respect to an electrode element E.

FIG. 41 illustrates evaluation points P1 to P5 with respect to the electrode element E. Ions which are incident on the wafer Wf right above the evaluation points P1 to P5 are evaluated. Specifically, electric fields on both sides of the electrode element E1 are evaluated.

Note that there is a strong electric field due to an edge effect in the vicinity of an end portion of the electrode element E, which exerts an influence on an evaluation of the oblique component, so that the electric field in the vicinity of the center of the wafer Wf is evaluated.

Figure 38A:
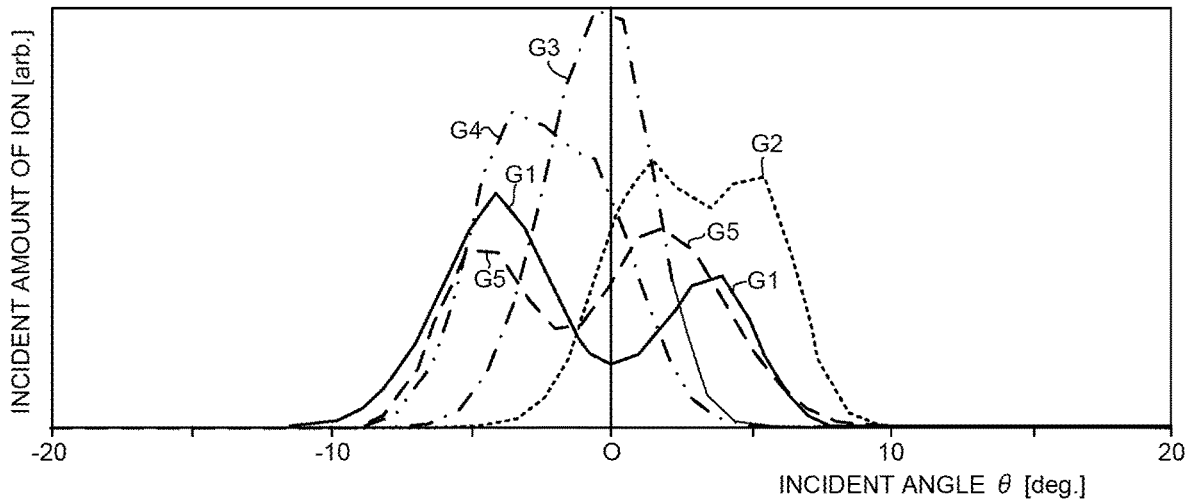
FIG. 38A to FIG. 38C are graphs each illustrating a result of plasma simulation of angle distributions of ions II which are incident on a wafer Wf.
Figure 38B:
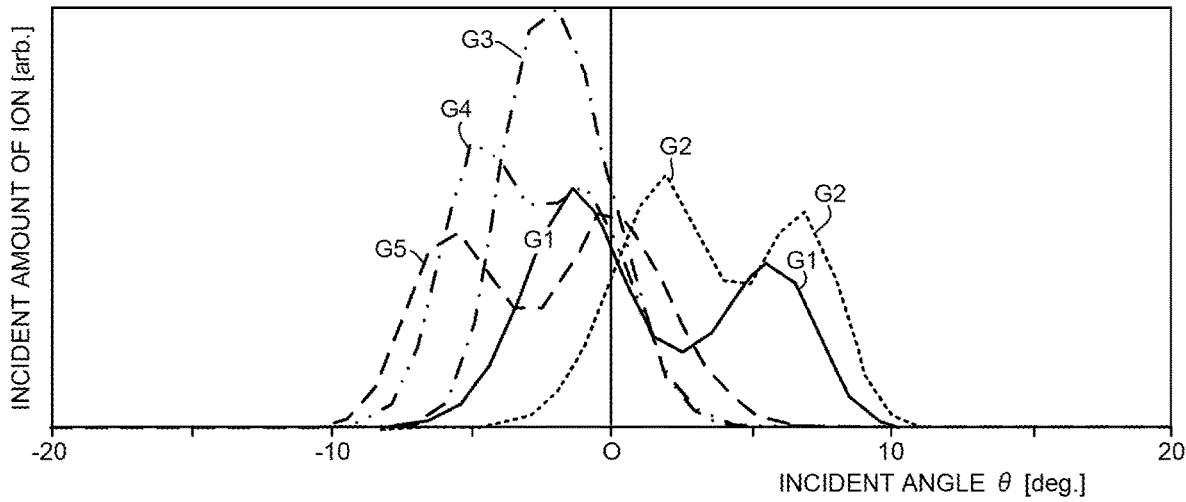
Figure 38C:
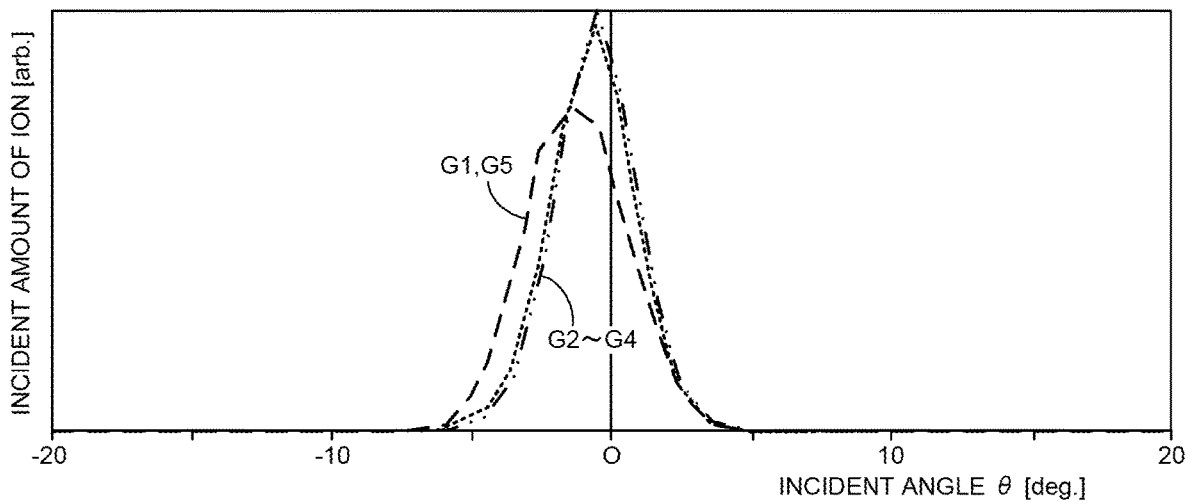

Graphs G1 to G5 in each of FIG. 38A to FIG. 38C correspond to the evaluation points P1 to P5.

FIG. 38A illustrates a result when the electrode width W is 2 mm, the electrode interval D is 4 mm, and only the RF low-frequency voltage Vb is turned on or off The evaluation points P1 and P5, and the evaluation points P2 and P4 are respectively positioned symmetric in the right and left directions with respect to a center of the electrode (evaluation point 3). It can be understood that, with respect to one electrode, the angle distributions at symmetric positions are approximately symmetric (signs are opposite, and angle peak positions are approximately the same). Therefore, a good process uniformity can be achieved on the entire wafer Wf.

The reason why the angle distributions are not perfectly symmetric in the right and left directions is because there is a distribution in a plasma density in the present simulation, and thus a bias in the oblique component according to the distribution is caused. When the plasma density is uniform in the entire wafer Wf, symmetric angle distributions are provided.

FIG. 38B illustrates a result when the electrode width W is 3 mm, and the electrode interval D is 3 mm. An incidence of oblique ions having a peak at 0 to 5 degrees is confirmed. Also in this case, the right and left distributions are close to symmetric distributions, so that the uniformity in the entire wafer is good.

FIG. 38C illustrates a result when the electrode width W is 1 mm, and the electrode interval D is 1 mm. The peak angle of the oblique component is about 1 to 2 degrees, and thus it can be understood that the incidence is close to the vertical incidence. Specifically, when each of the electrode width W and the electrode interval D is small, the generated oblique component becomes weak.

Explanation will be made on a dielectric constant of a dielectric.

Figure 39A:
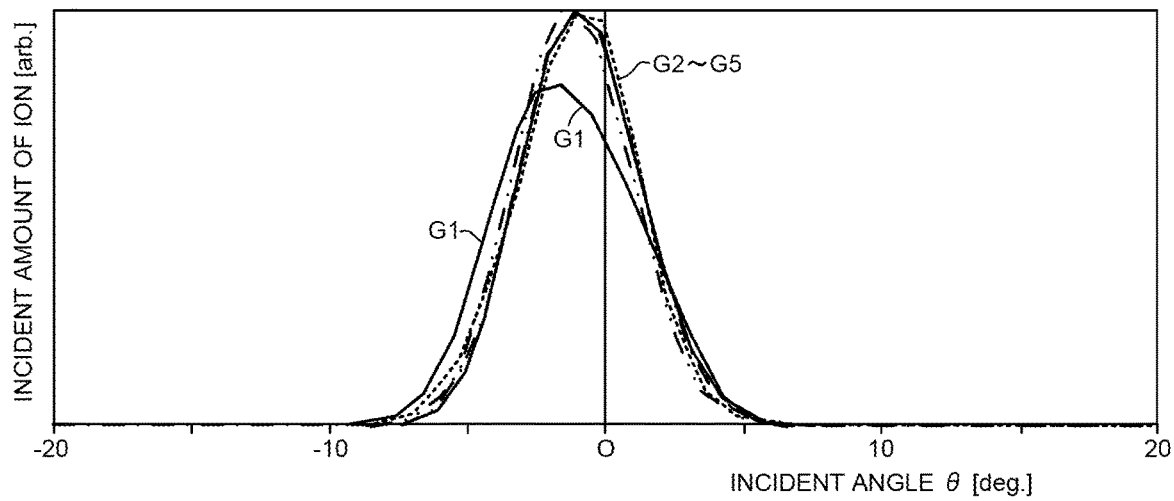
FIG. 39A to FIG. 39C are graphs each illustrating a result of plasma simulation of angle distributions of ions II which are incident on the wafer Wf.
Figure 39B:
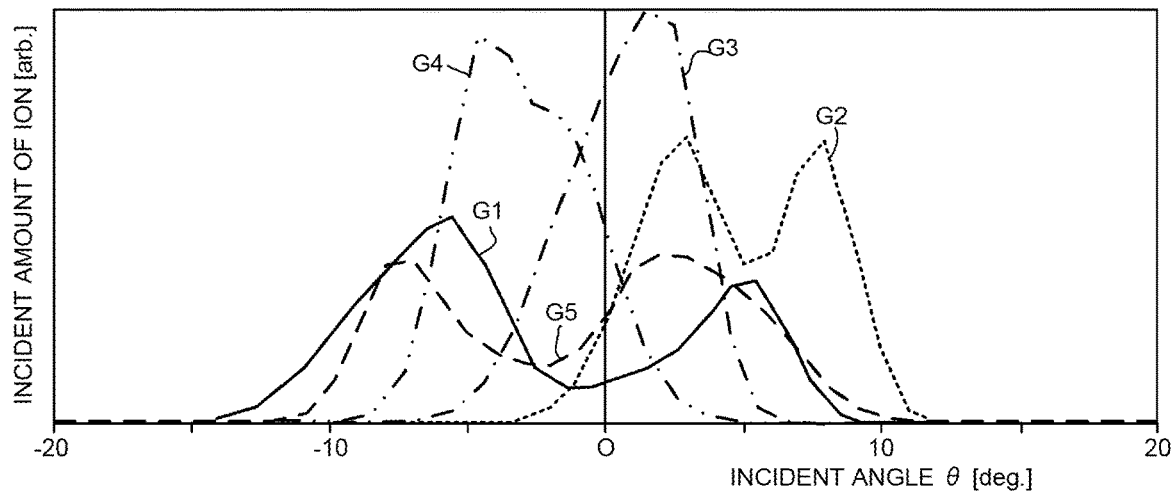
Figure 39C:
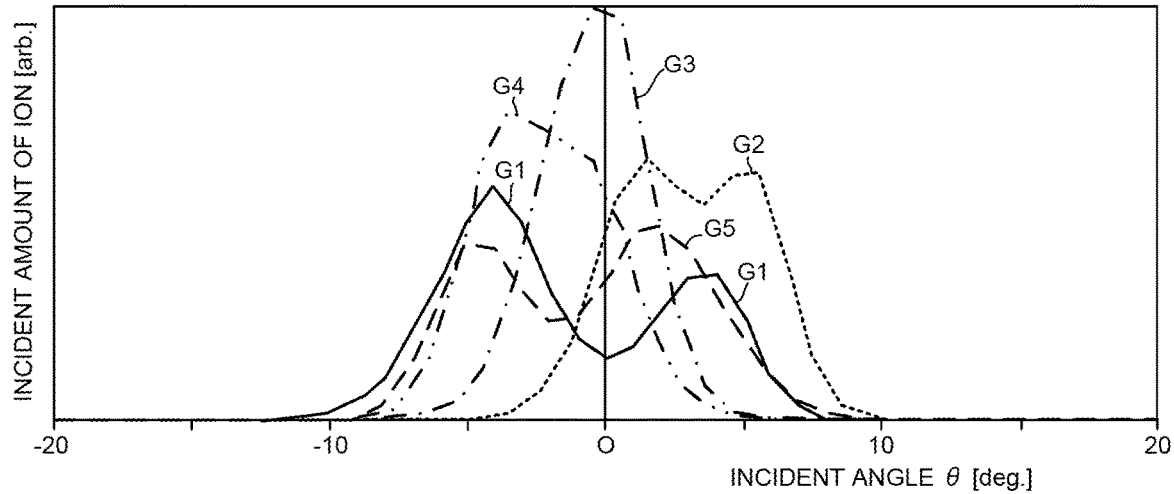

FIG. 39A to FIG. 39C illustrate results obtained by changing a dielectric constant of a dielectric member disposed in the electrode interval D. Here, the electrode width W is set to 2 mm, the electrode interval D is set to 4 mm, and a relative dielectric constant is changed in three ways of 1, 7.7, and 14.

As illustrated in FIG. 39A, when the relative dielectric constant is 1, the oblique component is not generated almost at all. In a medium with small dielectric constant, a potential drop is large. Therefore, a potential difference between adjacent electrode elements E becomes small before it reaches the wafer Wf.

As illustrated in FIG. 39B and FIG. 39C, in the cases where the relative dielectric constants are 7.7 and 14, a potential difference between adjacent electrodes is maintained until when it reaches the wafer Wf, resulting in that oblique ions are incident. In each of the above cases, preferable distributions close to distributions symmetric in the right and left directions and having peaks at about ±5 degrees, are obtained.

From the above description, it can be understood that the dielectric constant is preferably large to some degree, although depending on the electrode width W and the electrode interval D.

An effective range regarding the electrode width W and the electrode interval D will be described.

The oblique ions are effectively incident when an aspect ratio of a depth of hole becomes 20 or more, and an angle of up to about 5 degrees contributes to an improvement in shape of a bottom portion of the hole H. If processing of hole or trench in a conventional range in which the aspect ratio is smaller than the aforementioned aspect ratio is conducted, only the conventional vertical processing method can be employed to deal with the processing.

Figure 42A:
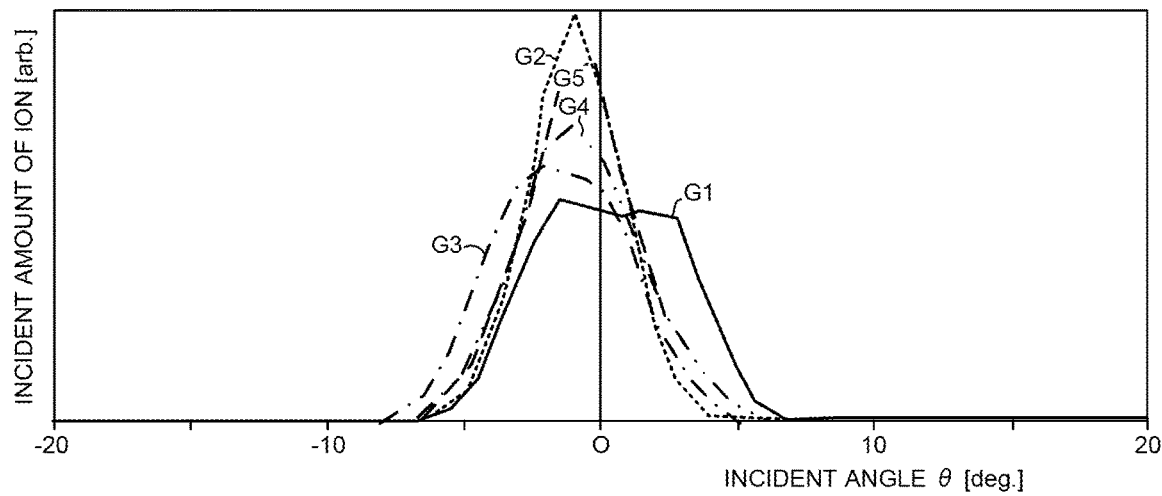
FIG. 42A to FIG. 42C are graphs each illustrating a result of plasma simulation of angle distributions of ions II which are incident on the wafer Wf.
Figure 42B:
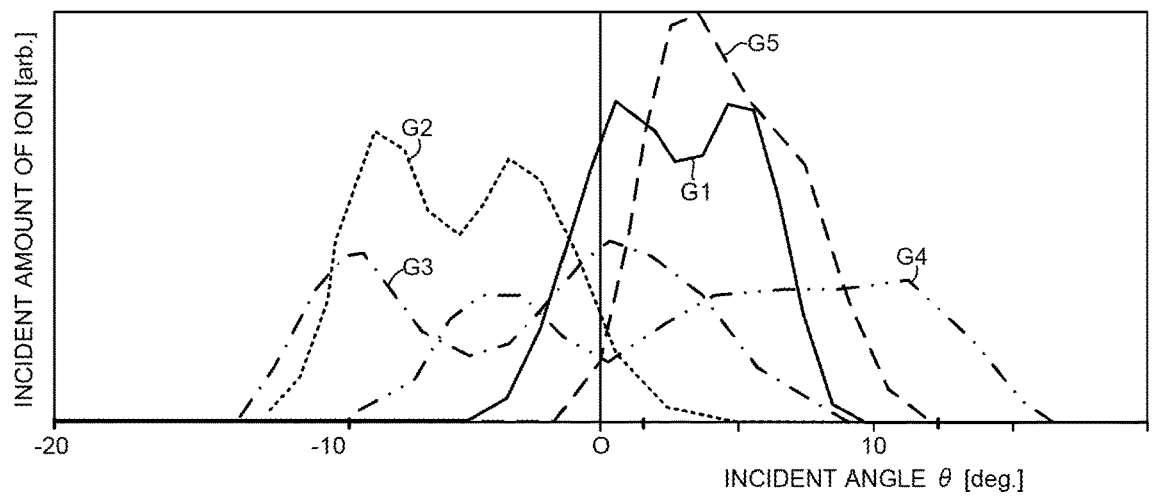
Figure 42C:
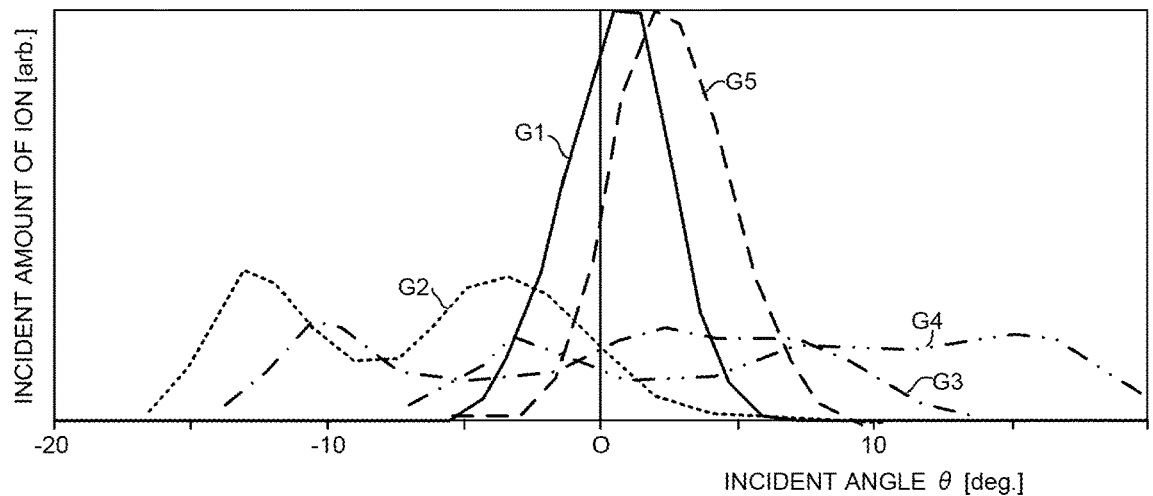

FIG. 42A to FIG. 42C are graphs each illustrating a result of plasma simulation of angle distributions of ions II which are incident on the wafer Wf in the plasma processing apparatus 10.

Figure 43:
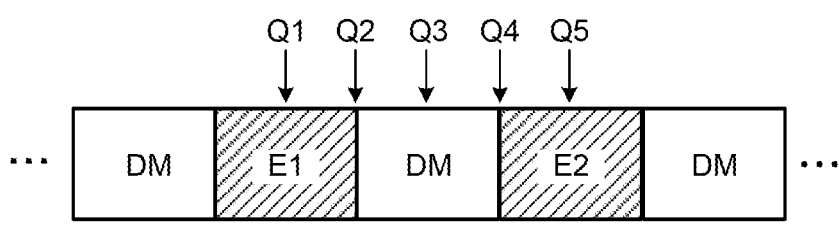
FIG. 43 is a diagram illustrating evaluation points Q1 to Q5 with respect to a dielectric member DM.

FIG. 43 illustrates evaluation points Q1 to Q5 with respect to the dielectric member DM. Ions which are incident on the wafer Wf right above the evaluation points Q1 to Q5 are evaluated. Specifically, electric fields on both sides of one dielectric member DM are evaluated.

FIG. 42A to FIG. 42C illustrate the angle distributions when both of the RF high-frequency voltage Va and the RF low-frequency voltage Vb are applied by being turned on or off The electrode interval D is fixed (2 mm), and the electrode width W is changed to 1, 4, and 7 mm.

Graphs G1 to G5 in each of FIG. 42A to FIG. 42C correspond to the evaluation points Q1 to Q5.

It can be understood that when the electrode width W is 1 mm, the oblique component is not generated almost at all, and the incidence is close to the vertical incidence. It can be understood that when the electrode width W is 4 mm, a distribution having a definite peak is provided, and when the electrode width W is 7 mm, the definite peak is eliminated in the angle distribution, and further, an etching rate is lowered. As described above, the electrode width W has an appropriate range.

Figure 44:
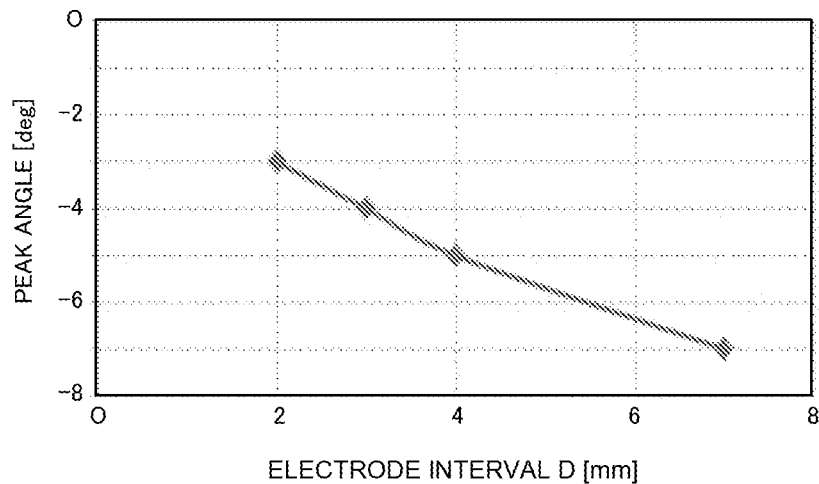
FIG. 44 is a graph illustrating a relation between an electrode interval D and a peak angle.
Figure 45:
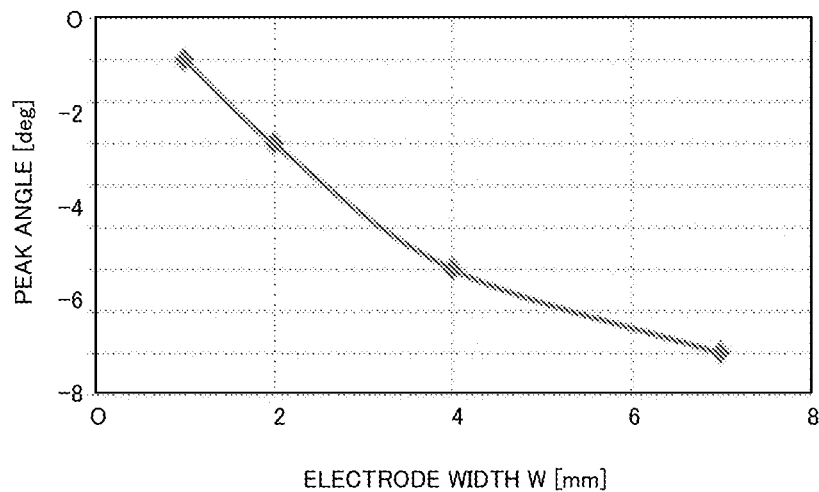
FIG. 45 is a graph illustrating a relation between an electrode width W and a peak angle.

FIG. 44 illustrates a relation between the electrode width W and the peak angle, and FIG. 45 illustrates a relation between the electrode interval D and the peak angle.

An absolute value of the peak angle becomes large as the electrode width W and the electrode interval D increase. It can be understood that each of the electrode width W and the electrode interval D is preferably about 1 to 5 mm (more preferably, about 2 to 5 mm).

This can be explained as follows based on a reason why the oblique component is generated. Specifically, a sheath of the plasma PL on the wafer Wf is curved by corresponding to a curve of the potential distribution. When the ions are vertically incident with respect to the curved sheath, the ions are obliquely incident on the wafer Wf.

For example, in a capacitive coupling type plasma (CCP) process in which the electrode interval is 3 cm, a sheath thickness is typically about 1 to 5 mm.

When each of the electrode width W and the electrode interval D is smaller than about 1 mm, a spatial deformation scale of sheath becomes smaller than the sheath thickness, resulting in that the deformation of sheath is eliminated. Specifically, the oblique component is not generated or becomes weak.

Further, it is also not preferable that each of the electrode width W and the electrode interval D is larger than about 5 mm. First, when the electrode width is large, the electric field is constantly directed vertically to the wafer Wf on the electrode, and thus ions are constantly incident vertically. When the electrode interval D is large, the electric field becomes weak on the whole, resulting in that the plasma density is lowered, and the process rate is lowered. Therefore, the electrode width W of 2 to 5 mm and the electrode interval D of about 2 to 5 mm, are conditions suitable for the oblique incidence process.

Although not illustrated, according to simulations, also when the wafer Wf is rotated, a result which is approximately the same as that of the case where the wafer Wf is not rotated (FIG. 38A to FIG. 38C, FIG. 39A to FIG. 39C, and FIG. 42A to FIG. 42C) is obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of plasma processing method with a plasma processing apparatus, the apparatus comprising:
   a substrate electrode disposed in a chamber, the substrate electrode including a plurality of first and a plurality of second electrode elements alternately arranged;
   a counter electrode facing on the substrate electrode;
   a high-frequency power source configured to output a high-frequency voltage of 40 MHz or more to apply the high-frequency voltage to the substrate electrode for ionizing the process gas to generate plasma;
   a low-frequency power source configured to output a low-frequency voltage of 20 MHz or less for introducing ions from the plasma; and
   a switching mechanism configured to apply the low-frequency voltage alternately to the plurality of first electrode elements and the plurality of second electrode elements, the plasma processing method comprising:
   mounting a substrate directly or indirectly on the substrate electrode;
   decreasing a pressure in the chamber and introducing a process gas;
   generating plasma from the process gas; and
   attracting ion included in the plasma to the substrate by switching application of the low-frequency voltage to the plurality of first electrode elements and the plurality of second electrode elements, the attracted ion being obliquely incident on the substrate, wherein
   the switching application of the low-frequency voltage is performed so as to repeat a first to a fourth state in sequence while applying the high-frequency voltage to the counter electrode, the first state being defined by the plurality of first electrode elements connected to a low-frequency power source applying the low-frequency voltage, and the plurality of second electrode elements not connected to the low-frequency power source, the second state being defined by both of the plurality of first electrode elements and the plurality of second electrode elements connected to the low-frequency power source, the third state being defined by the plurality of first electrode elements not connected to the low-frequency power source, and the plurality of second electrode elements connected to the low-frequency power source, and the fourth state being defined by both of the plurality of first electrode elements and the plurality of second electrode elements connected to the low-frequency power source.

2. The method according to claim 1, wherein widths of the first and the second electrode elements are not less than 1 mm nor more than 5 mm; and intervals between the plurality of first electrode elements and the plurality of second electrode elements are not less than 1 mm nor more than 5 mm.

3. The method according to claim 1, wherein the substrate electrode is relatively rotated to the substrate, and a period T of switching the plurality of first electrode elements and the plurality of second electrode elements is not 0.5n times a period Tr of the rotation, where n: integer.

4. The method according to claim 1, wherein the switching mechanism is configured to apply the low-frequency voltage to the plurality of first electrode elements simultaneously in the first state.

5. The method according to claim 1, wherein the counter electrode is a shower head.

6. The method according to claim 1, wherein the plasma processing apparatus does not require an accelerator.

7. The method according to claim 1, wherein an electric field is generated in a direction parallel to a plane of the substrate electrode by switching the application of the low-frequency voltage to the plurality of first electrode elements and the plurality of second electrode elements.

8. The method according to claim 1, wherein the plurality of first electrode elements and the plurality of second electrode elements are arranged in a first direction and each extending in a plane direction.

* * * * *